US008507970B2

(12) United States Patent
Jeong et al.

(10) Patent No.: US 8,507,970 B2
(45) Date of Patent: Aug. 13, 2013

(54) THREE-DIMENSIONAL SEMICONDUCTOR MEMORY DEVICE

(75) Inventors: Jaehun Jeong, Hwaseong-si (KR); Hansoo Kim, Suwon-si (KR); Jaehoon Jang, Seongnam-si (KR); Sunil Shim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 256 days.

(21) Appl. No.: 12/818,354

(22) Filed: Jun. 18, 2010

(65) Prior Publication Data

US 2010/0320528 A1 Dec. 23, 2010

(30) Foreign Application Priority Data

Jun. 22, 2009 (KR) ........................ 10-2009-0055441

(51) Int. Cl.
*H01L 29/788* (2006.01)

(52) U.S. Cl.
USPC .................................. 257/316; 257/E21.409

(58) Field of Classification Search
USPC .......................................... 257/316, E21.409
See application file for complete search history.

(56) References Cited

U.S. PATENT DOCUMENTS

| 2008/0173928 A1 | 7/2008 | Arai et al. |
| 2009/0121271 A1* | 5/2009 | Son et al. ........................ 257/315 |
| 2010/0276743 A1 | 11/2010 | Kuniya et al. |

FOREIGN PATENT DOCUMENTS

| JP | 2007317874 | 12/2007 |
| JP | 2008171838 | 7/2008 |
| JP | 2008159699 | 6/2010 |
| KR | 1020080058251 | 6/2008 |

* cited by examiner

*Primary Examiner* — Stephen W Smoot
*Assistant Examiner* — Vicki B Booker
(74) *Attorney, Agent, or Firm* — Onello & Mello, LLP

(57) ABSTRACT

In a three-dimensional semiconductor memory device, the device includes a semiconductor substrate having a recessed region, an active pattern extending in a direction transverse to the recessed region, an insulating pillar being adjacent to the active pattern and extending in the direction transverse to the recessed region, and a lower select gate facing the active pattern and extending horizontally on the semiconductor substrate. The active pattern is disposed between the insulating pillar and the lower select gate.

21 Claims, 27 Drawing Sheets

THREE-DIMENSIONAL SEMICONDUCTOR MEMORY DEVICE

CROSS-REFERENCE TO RELATED APPLICATIONS

This U.S. non-provisional patent application claims priority under 35 U.S.C. §119 to Korean Patent Application 10-2009-0055441, filed on Jun. 22, 2009, the entire contents of which are hereby incorporated by reference.

BACKGROUND

The present disclosure herein relates to a semiconductor memory device, and more particularly, to a three-dimensional semiconductor memory device.

There continues to be an ever-increasing demand for further integration of semiconductor devices having superior performance and lower price. In semiconductor memory devices, a higher integration degree is particularly necessary, since the integration degree is a significant factor in determining the resulting price. In present two-dimensional or planar memory semiconductor devices, since the integration degree is determined by the occupying area of a unit memory cell, the integration degree is considerably affected by the technique for forming fine patterns. In order to achieve the formation of minute patterns, however, highly expensive equipment is necessary.

As an alternative, development continues on techniques for forming three-dimensionally memory cells. According to these techniques, since memory cells are arranged in three-dimensions, the area of semiconductor substrate is effectively utilized. As a result, the integration degree may be largely increased as compared to the known two-dimensional memory semiconductor devices. In addition, word lines can be formed by using a patterning process to define an active region, thereby greatly reducing a manufacturing cost per unit bit of memory.

SUMMARY

The present disclosure provides a three-dimensional semiconductor memory device that offers reduced cost of manufacture and improved reliability.

Embodiments of the inventive concept provide a three-dimensional semiconductor memory device including a semiconductor substrate having a recessed region; an active pattern extending in a direction transverse to the recessed region; an insulating pillar being adjacent to the active pattern and extending in the direction transverse to the recessed region; and a lower select gate facing the active pattern and extending horizontally on the semiconductor substrate, wherein the active pattern is disposed between the insulating pillar and the lower select gate.

In some embodiments, the active pattern may have a cylindrical shape.

In other embodiments, the active pattern may be disposed to cover a lower surface and a side surface of the recessed region, and wherein the insulating pillar may fill the recessed region in which the active pattern is disposed.

In other embodiments, the position of a lower surface of the insulating pillar may be lower than that of an upper surface of the semiconductor substrate.

In other embodiments, the three-dimensional semiconductor memory device may further include a common source lines present in the semiconductor substrate and extending in parallel along a direction in which the lower select gate extends.

In other embodiments, the lower select gate may control a first channel region, which is defined in the semiconductor substrate between the active pattern and the common source line, and a second channel region, which is defined in the active pattern.

In other embodiments, the first channel region may contain dopants which adjust a threshold voltage.

In other embodiments, the first channel region may contain a first conductive type dopant, and the common source line may contain a second conductive type dopant.

In other embodiments, the three-dimensional semiconductor memory device may further include: word lines and an upper select gate being disposed on the lower select gate so as to be spaced apart from each other and extending horizontally; and information storage layers interposed between the active pattern and the lower select gate, between the active pattern and the word lines, and between the active pattern and the upper select line.

In other embodiments, the three-dimensional semiconductor memory device may further include a p-well provided in the semiconductor substrate, and the p-well may come into contact with the active pattern.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Figure 1:
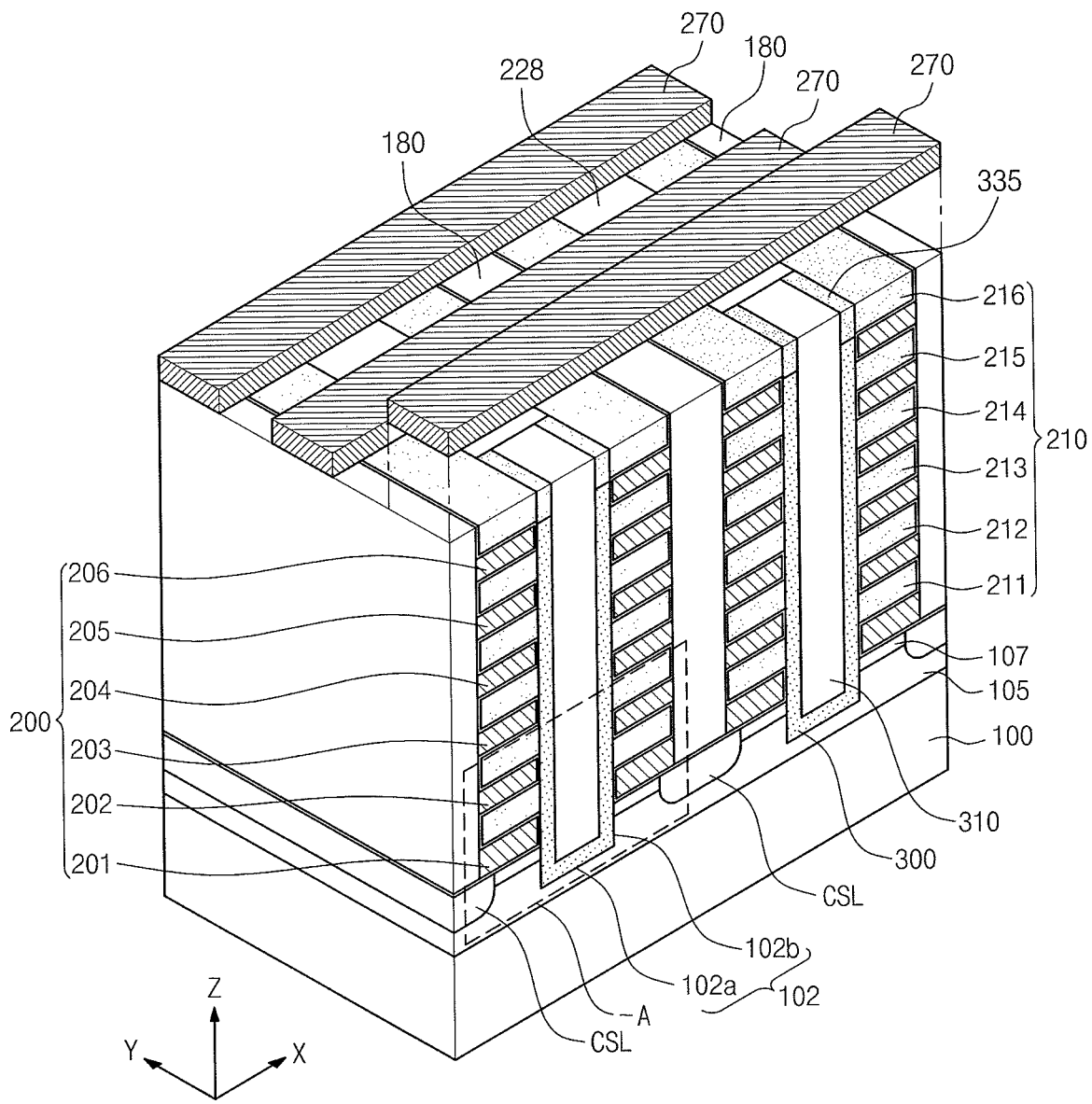
FIG. 1 is a diagram illustrating a three-dimensional semiconductor memory device according to an embodiment of the inventive concept.

Embodiments of the inventive concepts will be described with reference to the accompanying drawings so that those skilled in the art easily embody the technical spirit of the inventive concept. The exemplary embodiments of the inventive concepts may, however, be embodied in many different forms and should not be construed as being limited to the embodiments set forth herein. Rather, these embodiments are provided so that this disclosure will be thorough and complete and will fully convey the scope of the inventive concepts to those skilled in the art.

It will be understood that, although the terms first, second, etc. are used herein to describe various elements, these elements should not be limited by these terms. These terms are used to distinguish one element from another.

In drawings, the elements may be exaggerated to clearly describe technical details. Like reference numerals refer to like elements throughout the specification.

On the other hand, several exemplary embodiments are described to apply the technical spirit of the inventive concept and description of various modified embodiments is omitted for brevity. However, those skilled in the art may modify and apply the technical spirit of the inventive concept in various modifications based on the above description and exemplary embodiments.

Figure 3:
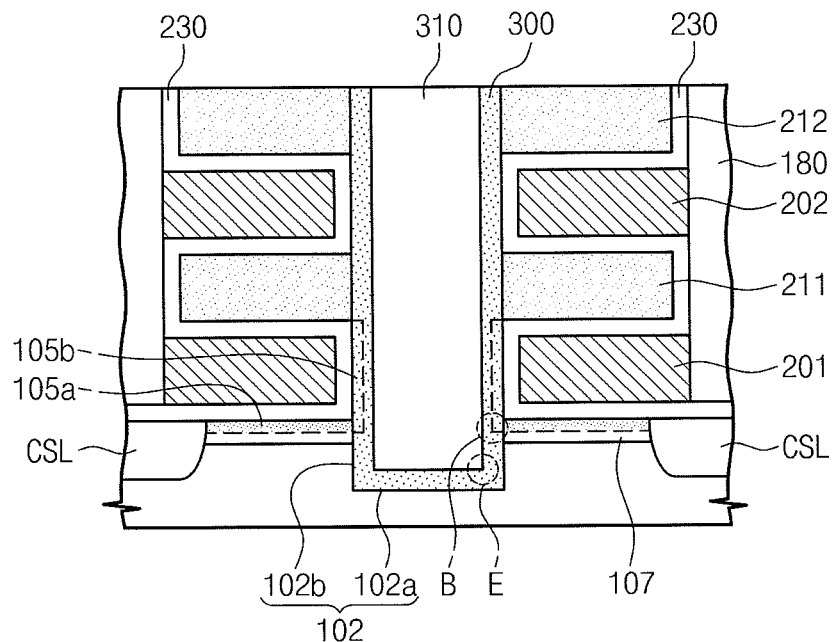
FIG. 3 is an enlarged diagram illustrating part A of FIGS. 1 and 2 according to the embodiments of the inventive concept.

FIGS. 1 and 3 are diagrams illustrating a three-dimensional semiconductor memory device according to an embodiment of the inventive concept. FIG. 3 is an enlarged diagram illustrating part A of FIG. 1.

Referring to FIGS. 1 and 3, a semiconductor substrate 100 includes a recessed region 102. The recessed region 102 may extend in a horizontal direction. An active pattern 300 is disposed to extend in a direction that is transverse to the horizontal direction of the recessed region 102. In one example, the active pattern 300 may extend vertically from the recessed region 102.

In various embodiments, the semiconductor substrate 100 may be, for example, a silicon substrate, a germanium substrate, or a silicon-germanium substrate. The active pattern 300 may be silicon, germanium, or silicon-germanium. The active pattern 300 may be formed of the same material, such as silicon, as that of the semiconductor substrate 100.

A lower select gate 201 is disposed on the semiconductor substrate 100 so as to face the active pattern 300 and extend horizontally. The lower select gate 201 may extend in the Y-axis direction, for example.

An insulating pillar 310 is disposed to be adjacent to the active pattern 300 and to extend in the direction distant from the recessed region 102. The active pattern 300 may be disposed between the insulating pillar 310 and the lower select gate 201. The active pattern 300 may be disposed to cover a lower surface 102a and a side surface 102b of the recessed region 102. The insulating pillar 310 may fill the recessed region 102 in which the active pattern 300 is disposed. The position of the lower surface of the insulating pillar 310 may be lower than that of the upper surface of the semiconductor substrate 100. That is, the corner E (where the lower surface and the side surface of the insulating pillar intersect with each other) of the insulating pillar 310 may be located at a position that is lower than the upper surface of the semiconductor substrate 100.

A p-well 105 may be formed in the semiconductor substrate 100. The p-well 105 may come into contact with the active pattern 300. A common source line CSL is disposed in the semiconductor substrate 100 so as to extend in parallel along a direction in which the lower select gate 201 extends. That is, the common source line CSL may extend in the Y-axis direction. The lower select gate 201 may control the operation of a first channel region 105a, which is defined in the semiconductor substrate 100 between the active pattern 300 and the common source line CSL, and a second channel region 105b, which is defined in the active pattern 300. The first channel region 105a may contain dopants to adjust a threshold voltage of the resulting device. The first channel region 105a may contain a first conductive type dopant and the common source line CSL may contain a second conductive type dopant. The first conductive type dopant may be of a p-type and the second conductive type dopant may be of an n-type. The active pattern 300 may not be doped with dopants. That is, the active pattern 300 may be in an intrinsic state.

Word lines 202, 203, 204, and 205 and an upper select gate 206 are disposed on the lower select gate 201 so as to be spaced apart from each other. Gate interlayer insulating layers 210 (211 to 216) are formed in the spaces between the lower select gate 201, the word lines 202 to 205, and the upper select gate 206. The stacked lower select gate 201, word lines 202 to 205, and upper select gate 206 form a word line structure 200. In the drawings, only four word lines 202 to 205 are illustrated in the word line structure 200 for easy description, but, in various embodiments, more word lines, such as eight, sixteen, or thirty-two word lines may be disposed, for example. The word line structure 200 may have a line shape extending in a first direction, as illustrated in FIG. 1. The first direction is parallel to the upper surface of the semiconductor substrate 100. The first direction may be the Y-axis direction.

The word line structure 200 is formed of a conductive material. For example, the word line structure 200 may contain at least one selected from doped Group 4A (or Group 14) elements (doped silicon, doped germanium, doped silicon-germanium, etc.), metal (tungsten, titanium, tantalum, aluminum, etc.), conductive metal nitride (titanium nitride, tantalum nitride, etc), and a metal-Group 4A element compound (tungsten silicide, cobalt silicide, titanium silicide, etc.). The gate interlayer insulating layers 210 may contain at least one selected from oxides, nitrides, carbides, oxynitrides and the like.

An information storage layer 230 is interposed between the word line structure 200 and the active pattern 300. The information storage layer 230 may include a charge storage layer for storing charge. Moreover, the information storage layer 230 may further include a tunnel insulating layer between the charge storage layer and the active pattern 300 and a blocking insulating layer between the charge storage layer and the word line structure 200. The charge storage layer may be formed of a material with traps for storing charges. For example, the charge storage layer may contain at least one selected from a nitride, an oxide, a dielectric substance containing nano-dots, metal nitride, and the like.

The tunnel insulating layer may contain at least one selected from oxides (thermal oxides, CVD oxides, etc.), nitrides, oxynitrides, and the like. The blocking insulating layer may contain at least one selected from oxides and high-k materials (metal nitrides such as a hafnium oxide or an aluminum oxide) having a dielectric constant higher than that of the tunnel insulating layer. A memory cell having the information storage layer 230 may be a non-volatile memory cell maintaining the stored data even when power supply is interrupted.

The word line structures 200 may be disposed relatively close in proximity to each other so that inversion regions thereof overlap with each other by a fringing field of a voltage to be applied. Plural memory cells, which are each formed by the word lines 202 to 205, the upper select gate 206, and the lower select gate 201 sharing the active pattern 300, may form one string. According to an embodiment of the inventive concept, the three-dimensional semiconductor memory device may be a NAND flash memory device so formed by the string.

The word line structure 200 includes a first sidewall adjacent to the active pattern 300 and a second sidewall opposite to the first sidewall. A gap-fill insulating layer 180 may be disposed between the second sidewalls of the word line structures 200. In the three-dimensional memory device, the active patterns 300 and the word line structures 200 may have a mirror-symmetric structure respectively based on the insulating pillar 310, and the word line structures 200 and the active patterns 300 may have a mirror-symmetric structure respectively based on the gap-fill insulating layer 180. An insulating separation pillar 228 is disposed between the adjacent insulating pillars 310.

The active pattern 300 adjacent to the gate interlayer insulating layer 216 on the upper select gate 206 may serve as a drain region 335. Bit lines 270 are disposed so as to extend in parallel along a direction intersecting the word line structure 200 and to be electrically connected to the drain region 335. The bit lines 270 may contain a conductive material.

Figure 2:
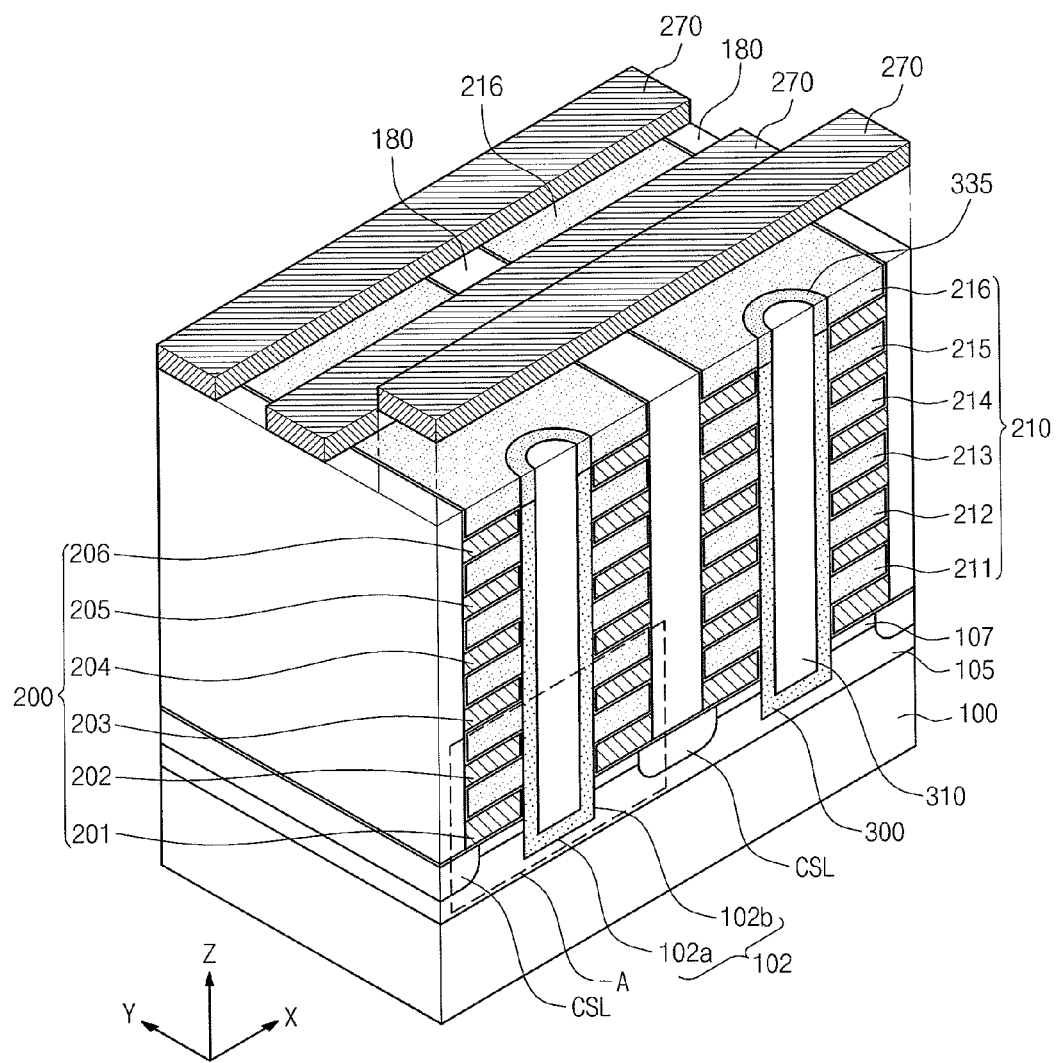
FIG. 2 is a diagram illustrating a three-dimensional semiconductor memory device according to another embodiment of the inventive concept.

FIGS. 2 and 3 are diagrams illustrating a three-dimensional semiconductor memory device according to another embodiment of the inventive concept. FIG. 3 is an enlarged diagram illustrating part A of FIG. 2. Since the configuration in FIG. 2 is similar to that of the above embodiment except for a difference in the shape of the active pattern, the duplicated technical features are omitted below for brevity.

Referring to FIGS. 2 and 3, a semiconductor substrate 100 includes a recessed region 102. The recessed region 102 may have a cylindrical shape. An active pattern 300 is disposed to extend in a direction that is transverse to the horizontal direction of extension of the recessed region 102. In one example, the active pattern 300 may extend in a vertical direction from the recessed region 102. The active pattern 300 may have a cylindrical shape.

A lower select gate 201 is disposed on the semiconductor substrate 100 so as to face the active pattern 300 and extend horizontally. The lower select gate 201 may extend in the Y-axis direction, for example.

An insulating pillar 310 is disposed to be adjacent to the active pattern 300 and to extend in the direction distant from the recessed region 102. The active pattern 300 may be disposed between the insulating pillar 310 and the lower select gate 201. The active pattern 300 may be disposed to cover a lower surface 102a and a side surface 102b of the recessed region 102. The insulating pillar 310 may fill the recessed region 102 in which the active pattern 300 is disposed. The position of the lower surface of the insulating pillar 310 may be lower than that of the upper surface of the semiconductor substrate 100. That is, the corner E (where the lower surface and the side surface of the insulating pillar intersect with each other) of the insulating pillar 310 may be located lower than the upper surface of the semiconductor substrate 100. The insulating pillar 310 may have a cylindrical shape.

A p-well 105 may be formed in the semiconductor substrate 100. The p-well 105 may come into contact with the active pattern 300. A common source line CSL is disposed in the semiconductor substrate 100 so as to extend in parallel along a direction in which the lower select gate 201 extends. That is, the common source line CSL may extend in the Y-axis direction. The lower select gate 201 may control the operation of a first channel region 105a, which is defined in the semiconductor substrate 100 between the active pattern 300 and the common source line CSL, and a second channel region 105b, which is defined in the active pattern 300. The first channel region 105a may contain dopant to adjust a threshold voltage of the resulting device. The first channel region 105a may contain first conductive type dopant and the common source line CSL may contain second conductive type dopant. The first conductive type dopant may be of a p-type and the second conductive type dopant may be of an n-type. The active pattern 300 may not be doped with dopant. That is, the active pattern 300 may be in an intrinsic state.

Word lines 202, 203, 204, and 205 and an upper select gate 206 are disposed on the lower select gate 201 so as to be spaced apart from each other. Gate interlayer insulating layers 210 (211 to 216) are farmed in the spaces between the lower select gate 201, the word lines 202 to 205, and the upper select gate 206. The stacked lower select gate 201, word lines 202 to 205, and upper select gate 206 form a word line structure 200. In the drawings, only four word lines 202 to 205 are illustrated in the word line structure 200 for easy description, but in various embodiments, more word lines such as eight, sixteen, or thirty-two word lines may be disposed, for example. The word line structure 200 may have a flat plate shape surrounding the active pattern 300, unlike that according to the above embodiment.

The word line structure 200 is formed of a conductive material. The gate interlayer insulating layers 210 may contain at least one selected from oxides, nitrides, carbides, oxynitrides, and the like. An information storage layer 230 is interposed between the word line structure 200 and the active pattern 300. The information storage layer 230 may include a charge storage layer for storing charges. Moreover, the information storage layer 230 may further include a tunnel insulating layer between the charge storage layer and the active pattern 300 and a blocking insulating layer between the charge storage layer and the word line structure 200. The charge storage layer may be formed of a material with traps for storing charges. A memory cell having the information storage layer 230 may be a non-volatile memory cell maintaining the stored data even when power supply is interrupted.

The word line structures 200 may be disposed relatively close in proximity to each other so that inversion regions thereof overlap with each other by a fringing field of a voltage to be applied. Plural memory cells, which are each formed by the word lines 202 to 205, the upper select gate 206, and the lower select gate 201 sharing the active pattern 300, may form one string. According to an embodiment of the inventive concept, the three-dimensional semiconductor memory device may be a NAND flash memory device formed by the string.

The word line structure 200 includes a circular inner wall adjacent to the active pattern 300 and an outer wall spaced apart from the active pattern 300. A gap-fill insulating layer 180 may be disposed between the outer walls of the word line structures 200. In the three-dimensional memory device, the active patterns 300 and the word line structures 200 may have a minor-symmetric structure respectively based on the insulating pillar 310, and the word line structures 200 and the active patterns 300 may have a mirror-symmetric structure respectively based on the gap-fill insulating layer 180.

The active pattern 300 adjacent to the gate interlayer insulating layer 216 on the upper select gate 206 may serve as a drain region 335. Bit lines 270 are disposed so as to extend in parallel along a direction intersecting the word line structure 200 and to be electrically connected to the drain region 335. The bit lines 270 may contain a conductive material.

Figure 4:
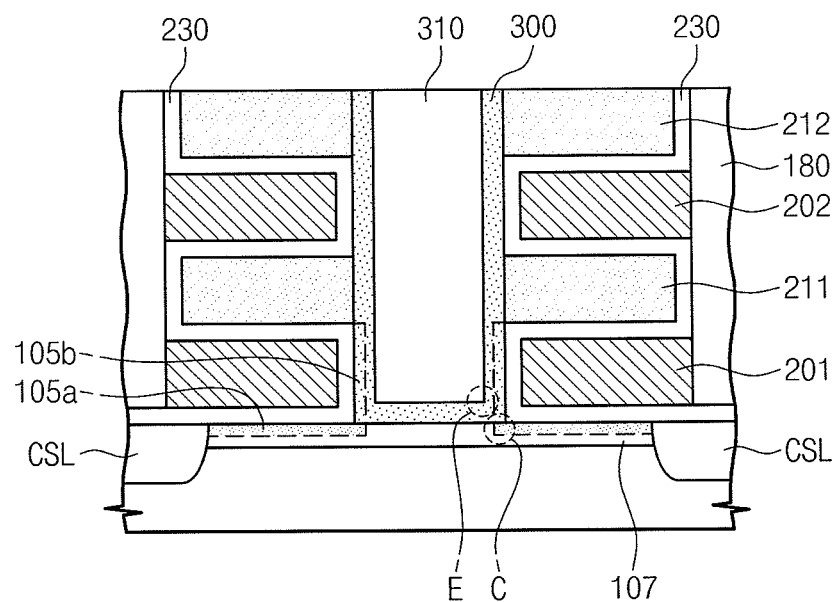
FIGS. 4 through 6 are diagrams illustrating a comparative example of the three-dimensional semiconductor memory device according to the embodiments of the inventive concept.
Figure 5:
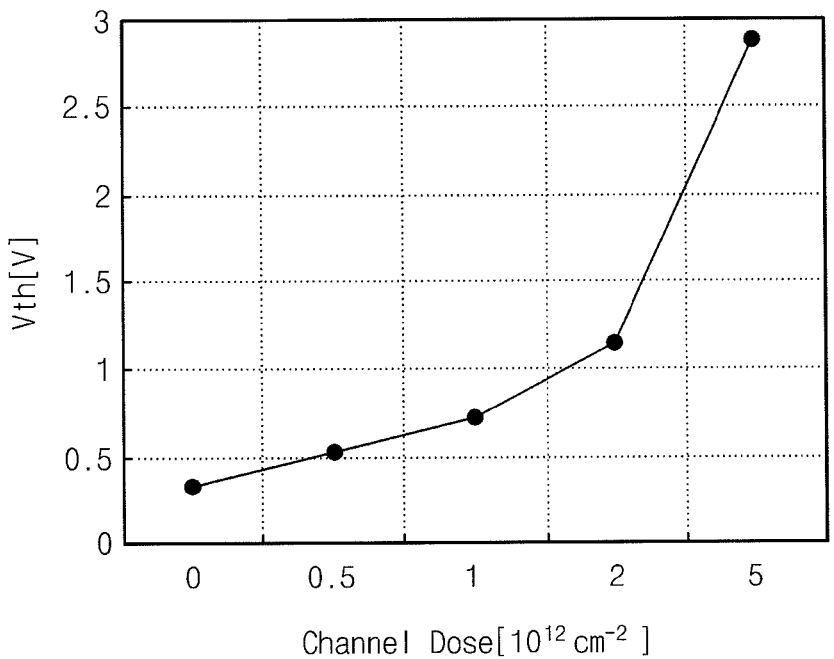
Figure 6:
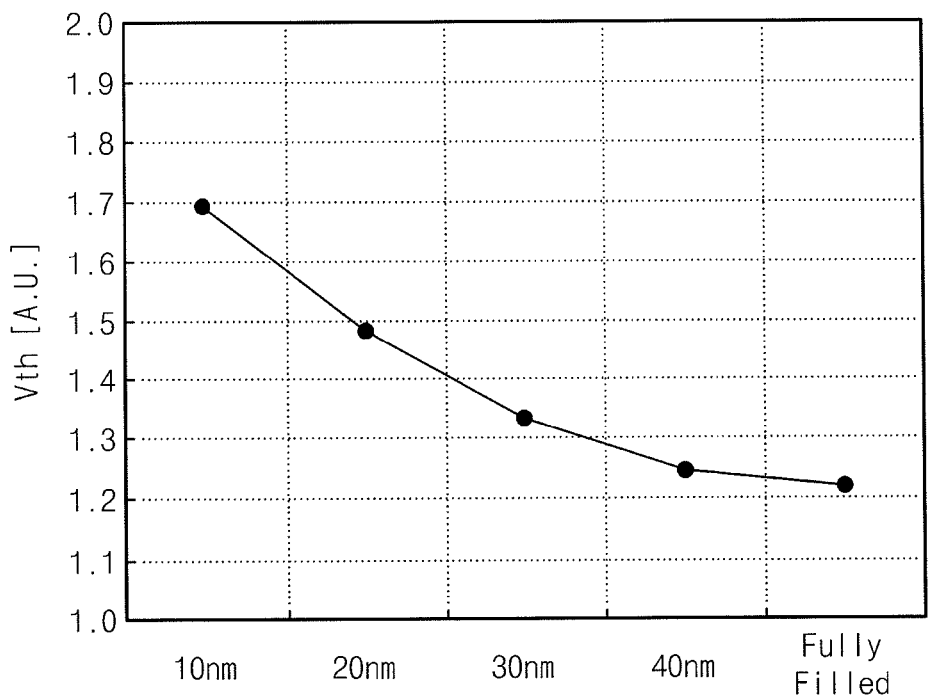

FIGS. 4 through 6 are diagrams illustrating a comparative example of the three-dimensional semiconductor memory device according to the embodiments of the inventive concept.

FIG. 4 is the diagram illustrating a part of the three-dimensional semiconductor memory device corresponding to the part illustrated in FIG. 3 according to the comparative example. In the comparative example, the lower surface of the active pattern 300 is at the same position as the upper surface of the semiconductor substrate 100. That is, the semiconductor substrate 100 includes no recessed region and the position of the lower surface of the insulating pillar 310 is higher than that of the upper surface of the semiconductor substrate 100.

In FIG. 4, the lower select gate 201 controls the first channel region 105a, which is defined in the semiconductor substrate 100, and the second channel region 105b, which is defined in the active pattern 300. A channel region which is the most distant from the lower select gate 201 is part C where the active pattern 300 comes into contact with the semiconductor substrate 100. A surface-doped layer 107 disposed on the surface of the semiconductor substrate 100 is provided to adjust the threshold voltage of the lower select gate 201. The dopant contained in the surface-doped layer 107 may have an effect on the threshold voltage of the first channel region 105a.

FIG. 5 is a graph illustrating a variation in threshold voltage Vth in accordance with a channel dose of the channel region of the lower select gate. Referring to FIG. 5, the threshold voltage more sharply varies as the channel dose of the channel region increases. This indicates that it is necessary to lower the channel dose of the channel region. In the configuration of FIG. 4, the active pattern 300 may be an intrinsic semiconductor which is not doped with dopant. The dopant of the surface doped layer 107 formed directly below the lower surface of the active pattern 300 may be diffused to the active pattern 300. For this reason, the channel dose of the second channel region 105b of the active pattern 300 may increase and it may be difficult to control the threshold voltage of the lower select gate 201.

On the contrary, referring again to FIG. 3, the semiconductor substrate 100 according to the embodiments of the inventive concepts includes the recessed region 102 and the active pattern 300 is disposed in the recessed region 102. No surface doping region 107 illustrated in FIG. 4 is disposed directly below the lower surface of the active pattern 300. With such a configuration, the channel dose of the active pattern 300, particularly, that of part B in FIG. 3 can be decreased by a larger extent than that of part C in FIG. 4. Accordingly, according to the embodiment of the inventive concept, the threshold voltage of the lower select gate 201 may decrease and the variation in the threshold voltage may be minimized. Moreover, in the lower select gate 201 of the embodiment of FIG. 3, part B may be more readily inversed by a turn-on voltage.

FIG. 6 is a graph illustrating a variation in the threshold voltage in accordance with the thickness of the active pattern 300. The horizontal axis represents the thickness of the active pattern and the vertical axis represents the threshold voltage Vth. "Fully filled" in the horizontal axis means that no insulating pillar is disposed. As seen in FIG. 6, the threshold voltage increases with decreasing thickness of the active pattern 300 (see FIG. 4). When the thickness of the active pattern 300 is reduced, this means that the corner E (where the lower surface and the side surface of the insulating pillar intersect with each other) of the insulating pillar is close to part C where the inversion scarcely occurs. Part B is scarcely inversed, since part B is away from the lower select gate 201. The corner E of the insulating pillar 310 may distort the electric field of the lower select gate 201. Specifically, since the electric field is focused on the corner E of the insulating pillar 310, part C may be hindered from becoming inverted. Accordingly, the distance between the corner E and part C of the insulating pillar 310 should be increased.

Referring to FIG. 3, the corner E and part B of the insulating pillar 310 are relatively spaced apart from each other in the embodiments of the inventive concept. That is, the position of the lower surface of the insulating pillar 310 is lower than that of the upper surface of the semiconductor substrate 100. Accordingly, it is possible to minimize the distortion of the electric field occurring in the corner E of the insulating pillar 310.

Figure 7:
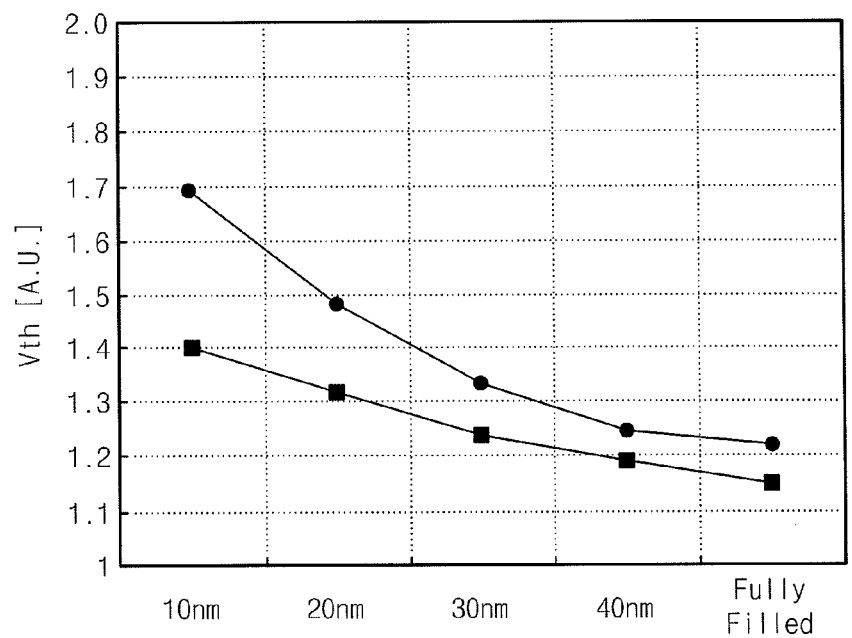
FIG. 7 is a graph illustrating a variation in a threshold voltage for the thickness of an active pattern according to an embodiment of the inventive concept and the comparative example.

FIG. 7 is a graph illustrating variations in the threshold voltages in accordance with the thickness of the active pattern according to the embodiments of the inventive concept and the comparative example. The horizontal axis represents the thickness of the active pattern and the vertical axis represents the threshold voltage Vth. Data values in FIG. 7 are simulation data. "Fully filled" in the horizontal axis means that no insulating pillar is disposed. In FIG. 7, the embodiments of the present inventive concepts are marked by -■- and the comparative example is marked by -●-.

Referring to FIG. 7, it can be known that the absolute value and variation value of the threshold voltage of the lower select gate according to the embodiments of the inventive concept are smaller. That is, the threshold voltage for the same thickness of the active pattern is smaller in the inventive embodiments than in the comparative example. Moreover, the variation value of the threshold voltage in accordance with the variation in the thickness of the active pattern is smaller in the embodiments than in the comparative example. According to the embodiments of the inventive concept, the threshold voltage of a lower select transistor is relatively less affected by the thickness of the active pattern. Moreover, the inversion region by a lower select gate may more readily occur.

Figure 8:
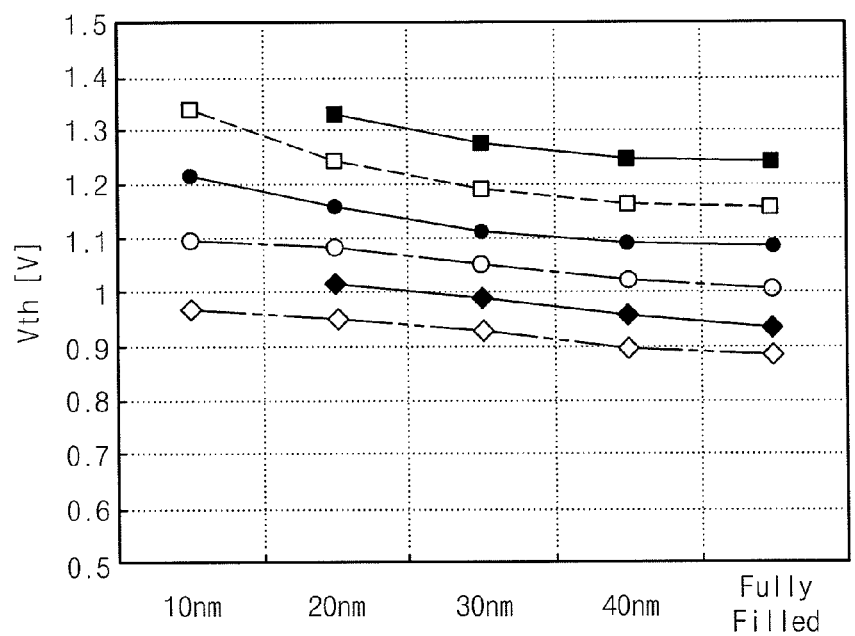
FIG. 8 is a graph illustrating a correlation between the depth of a recessed region and the threshold voltage according to an embodiment of the inventive concept.

FIG. 8 is a graph illustrating a correlation between the depth of the recessed region and the threshold voltage according to the embodiments of the inventive concept. The horizontal axis represents the thickness of the active pattern and the vertical axis represents the threshold voltage Vth. "Fully filled" in the horizontal axis means that no insulating pillar is disposed. In FIG. 8, a first embodiment is marked by -□-, a second embodiment is marked by -●-, a third embodiment is marked by -○-, a fourth embodiment is marked by -◆-, a fifth embodiment is marked by -◇-, and the comparative example is marked by -■-.

In the comparative example, no recessed region is formed in the semiconductor substrate. The depth of the recessed region is larger in order of the first embodiment to the fourth embodiment. For example, the depth of the recessed region is 10 nm in the first embodiment, the depth of the recessed region is 20 nm in the second embodiment, the depth of the recessed region is 30 nm in the third embodiment, the depth of the recessed region is 40 nm in the fourth embodiment, and the depth of the recessed region is 50 nm in the fifth embodiment.

Referring to FIG. 8, it can be known that the threshold voltage becomes smaller as the depth of the recessed region is larger. This means that as the depth of the recessed region is larger, the channel dose of the second channel region 105b (see FIG. 3) becomes lower and the distortion of the electric field of the lower select gate becomes minimized. Accordingly, as the depth of the recessed region is increased, the lower select gate can more readily form the inversion region. Moreover, it is possible to improve the reliability of the three-dimensional semiconductor memory device.

Figure 9:
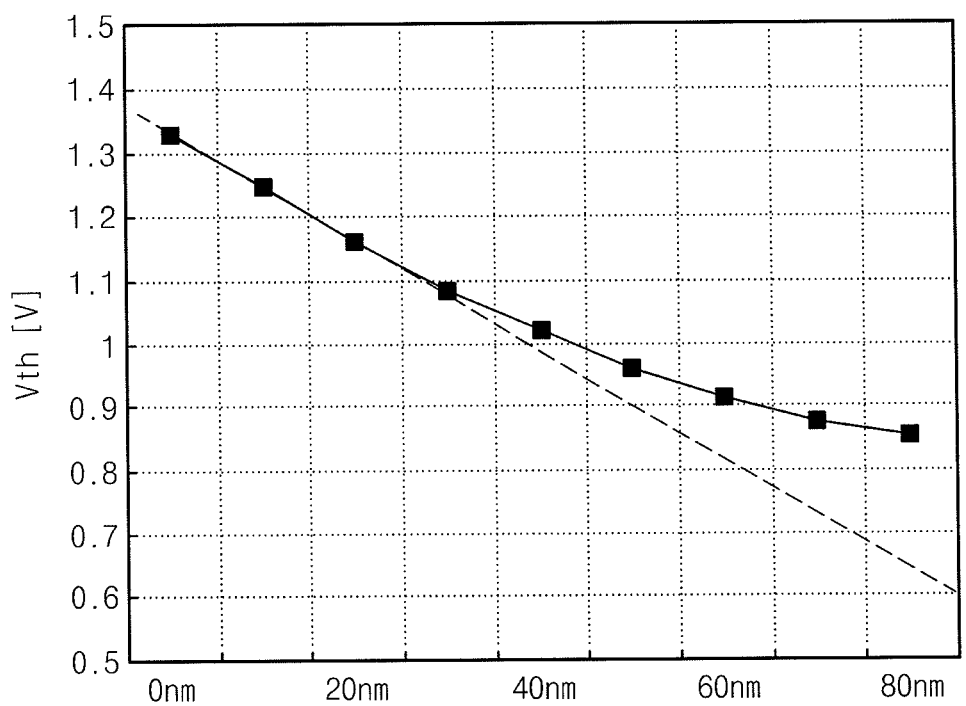
FIG. 9 is a graph illustrating a variation in the threshold voltage for the thickness of the recessed region according to an embodiment of the inventive concept.

FIG. 9 is a graph illustrating the variation in the threshold voltage in accordance with the depth of the recessed region according to the embodiments of the inventive concept. The horizontal axis represents the depth of the recessed region and the vertical axis represents the threshold voltage Vth. As the depth of the recessed region is increased, the variation in the threshold voltage Vth decreases. In other words, as the variation in the threshold voltage decreases, the uniformity of the threshold voltage of the lower select transistor may be ensured.

FIGS. 10A through 10K are diagrams illustrating a method of forming a three-dimensional semiconductor memory device according to an embodiment of the inventive concept.

Figure 10A:
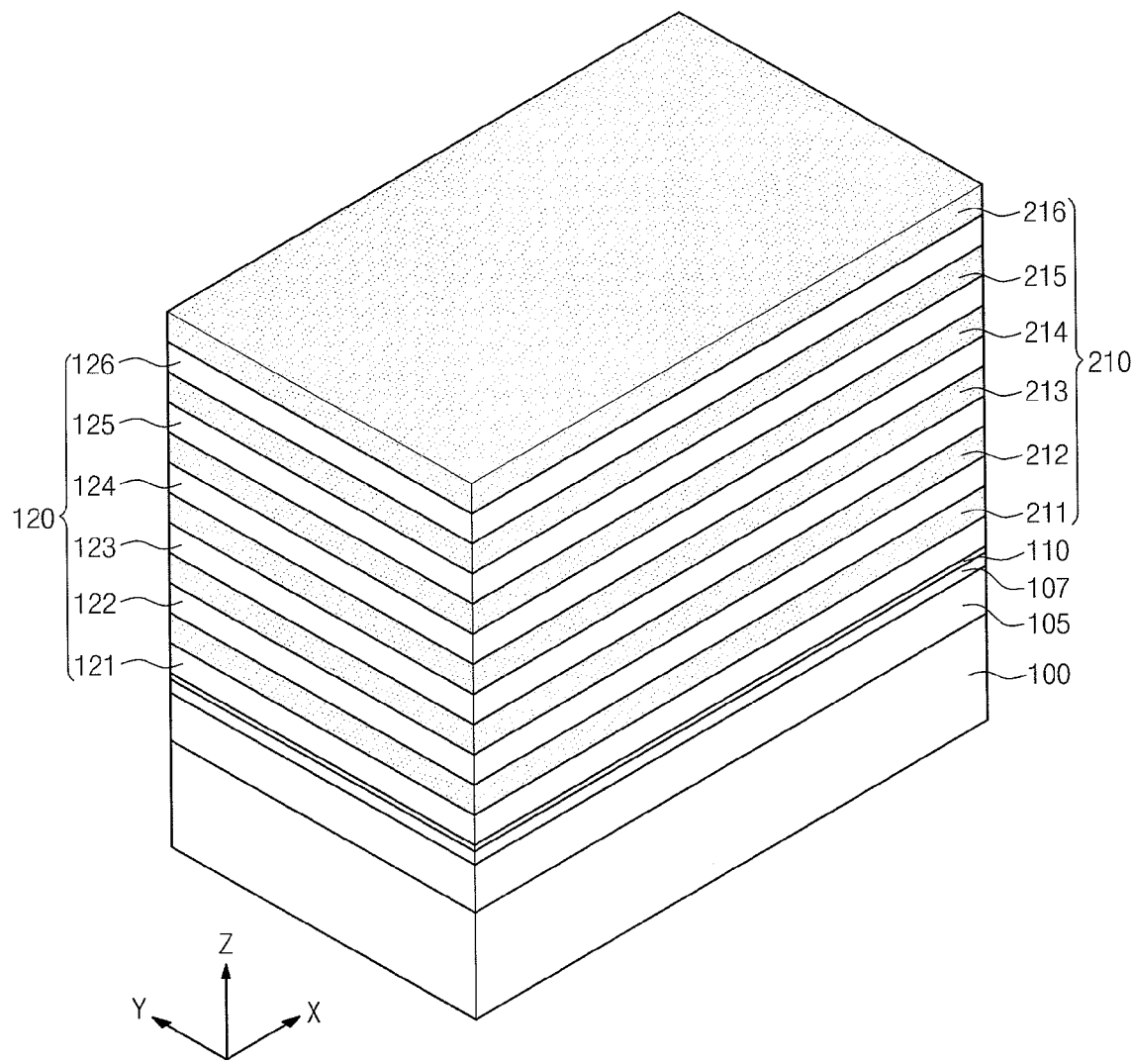
FIGS. 10A through 10K are diagrams illustrating a method of forming a three-dimensional semiconductor memory device according to an embodiment of the inventive concept.

Referring to FIG. 10A, the semiconductor substrate 100 including the well region 105 is prepared. The well region 105 may be formed by ion implantation. The well region 105 may contain p-type dopant. The surface doped layer 107 is formed on the surface of the semiconductor substrate 100. The surface doped layer 107 is a layer for adjusting the threshold voltage of the lower select gate which is described below. The surface doped layer 107 may contain the p-type dopant. Sacrificial layers 121, 122, 123, 124, 125, and 126 and the gate interlayer insulating layers 211, 212, 213, 214, 215, and 216 are alternately formed on the semiconductor substrate 100. That is, the sacrificial layers 121 to 126 arranged in a sacrificial layer structure 120 are stacked so as to be spaced apart from each other by the gate interlayer insulating layers 211 to 216, respectively. The interlayer gate insulting layers 211 to 216 interposed between the sacrificial layers 121 to 126, respectively, form a gate interlayer insulating structure 210.

The gate interlayer insulating layers 211 to 216 may be formed of at least one of insulating materials. For example, the gate interlayer insulating layers 211 to 216 may include at least one of a silicon oxide layer or a silicon nitride layer. The sacrificial layers 121 to 126 may be formed of materials which may be removed selectively while the gate interlayer insulating layers 211 to 216 are etched as less as possible. For example, when the gate interlayer insulating layers 211 to 216 are formed of a silicon oxide, the sacrificial layers 121 to 126 may be formed of a silicon nitride.

The sacrificial layer 121 is formed on the semiconductor substrate 100 earlier than the gate interlayer insulating layer 211 so that a lower select line, which is formed in the subsequent process, may effectively control the potential of the semiconductor substrate 100 or the well region 105. That is, the sacrificial layer 121 which is formed earliest, as illustrated, is more adjacent to the semiconductor substrate 100 than the gate interlayer insulating layer 211 which is formed earliest. A buffer layer 110 may be formed between the sacrificial layer 121 and the semiconductor substrate 100.

Figure 10B:
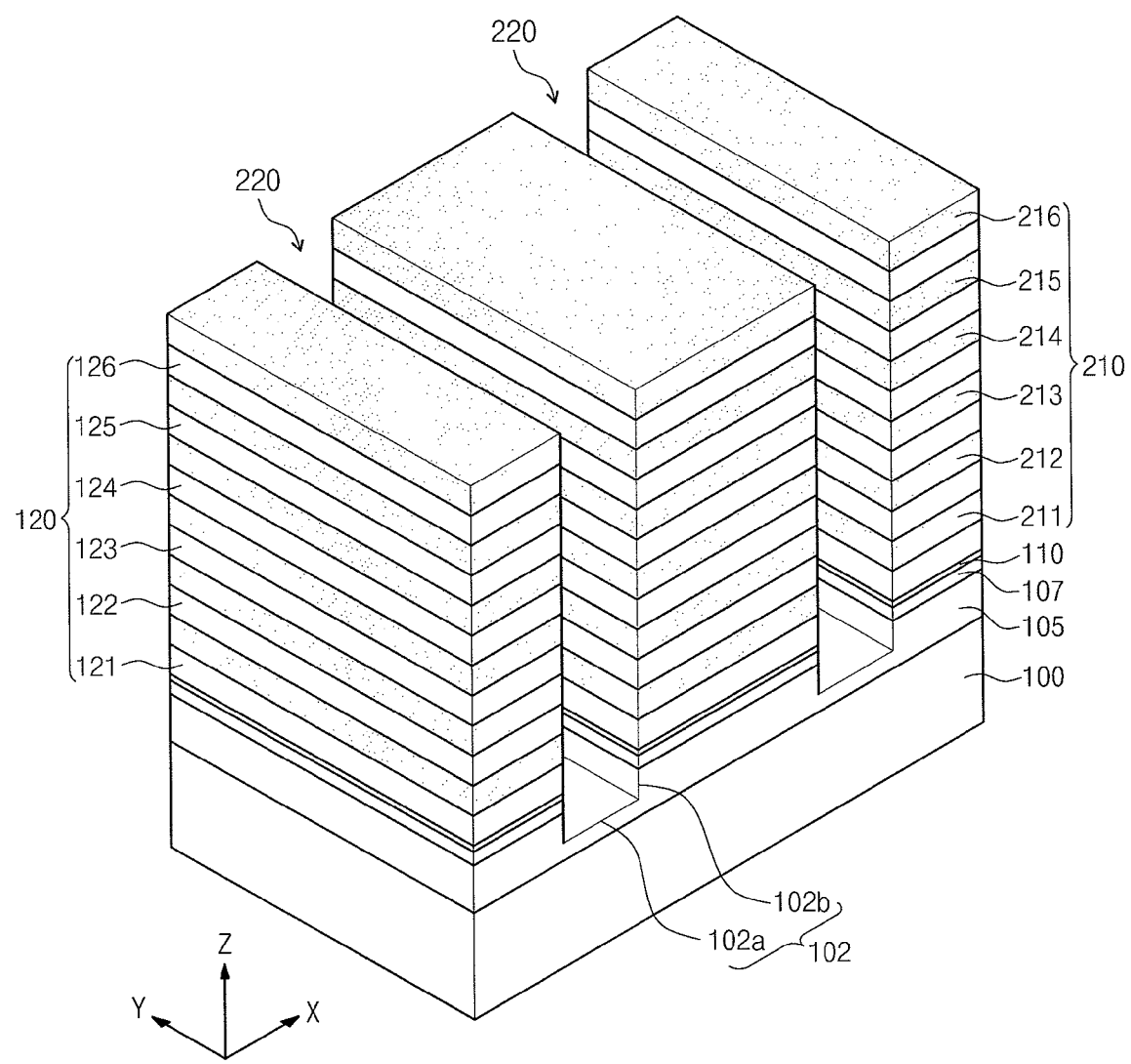
Figure 10C:
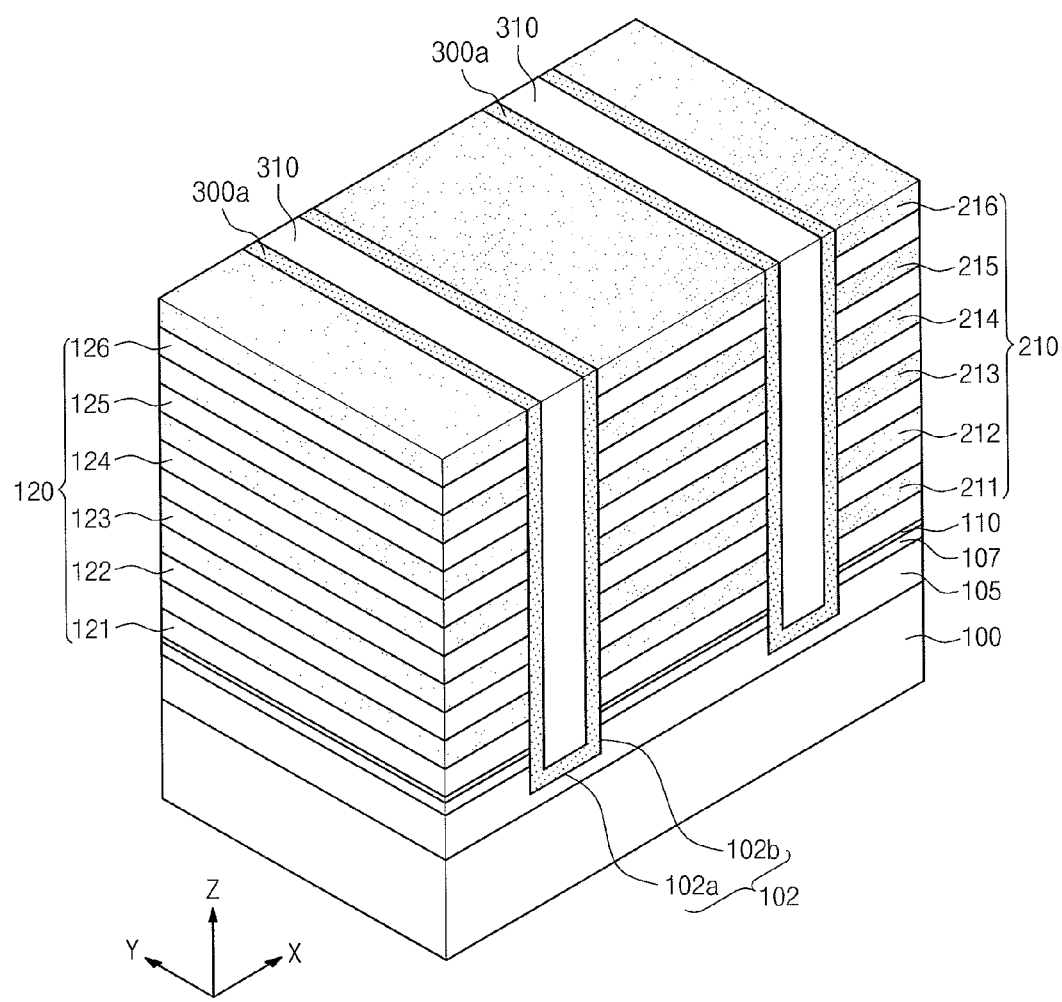

Referring to FIGS. 10B and 10C, the gate interlayer insulating structure 210 and the sacrificial layer structure 120 are patterned to form openings 220. The recessed region 102 is formed by etching the semiconductor substrate 100 exposed by the openings 220. Subsequently, as illustrated in FIG. 10C, a semiconductor layer 300a is formed to cover the inner wall of the opening 220 and the lower surface 102a and the side surfaces 102b of the recessed region 102. The semiconductor layer 300a is patterned in a direction intersecting the openings 220 in the subsequent process so as to be used as an active pattern (that is, a channel) forming a memory cell string.

The semiconductor layer 300a may be formed to conformally cover the inner wall of the opening 220 and the recessed region 102 by chemical vapor deposition. Alternatively, the semiconductor layer 300a may fill the openings 220 and the recessed region 102 by an epitaxial technique. The insulating pillar 310 is formed to fill the opening 220 and the recessed region 102 in which the semiconductor layer 300a is formed. The insulating pillar 310 may, for example, be formed of a silicon oxide or a silicon nitride.

Figure 10D:
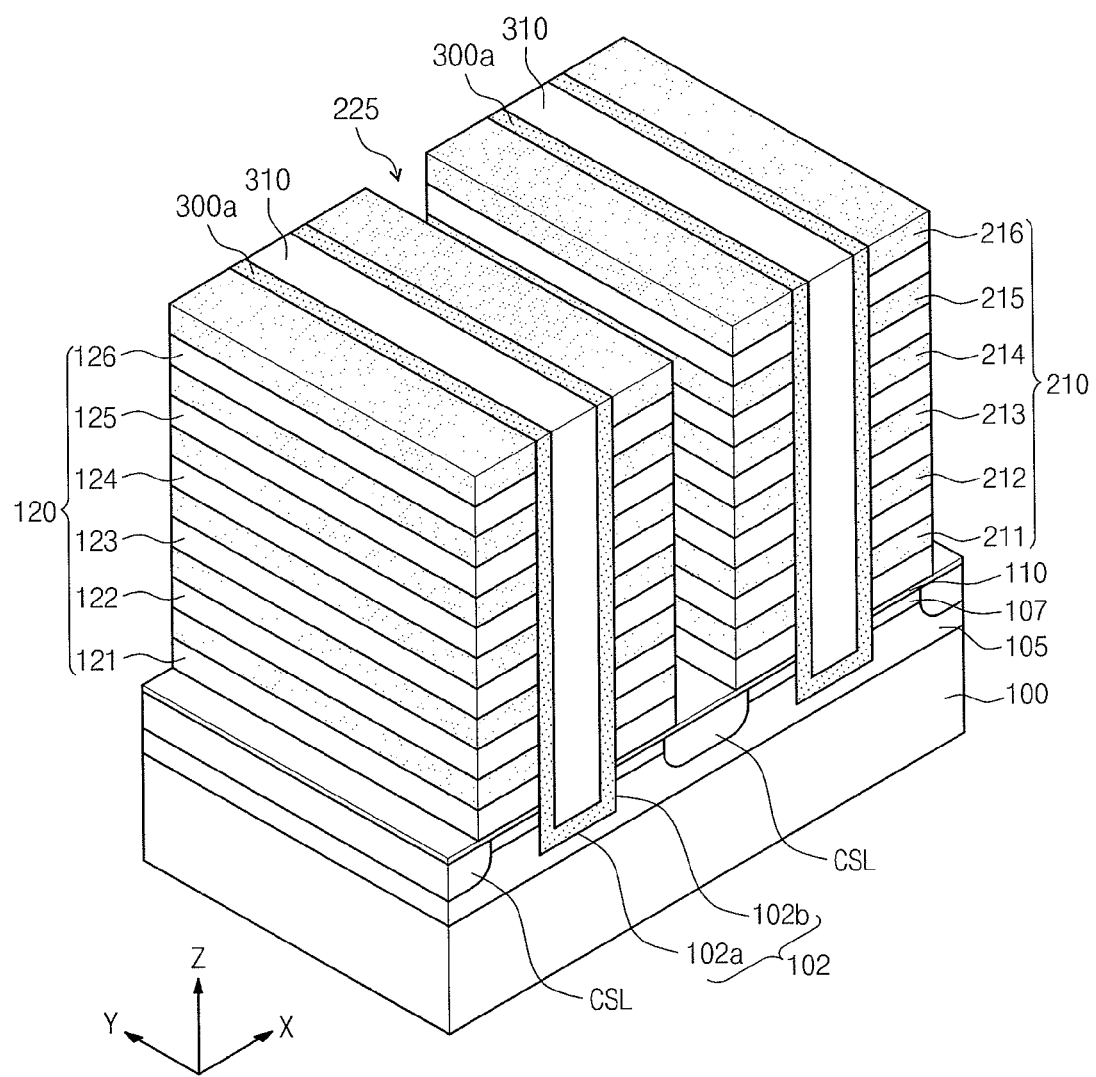

Referring to FIG. 10D, the gate interlayer insulating structure 210 and the sacrificial layer structure 120 are patterned again to form a preliminary gate isolation region 225 between the openings 220 to expose the upper surface of the semiconductor substrate 100 or the buffer layer 110. That is, the preliminary gate isolation region 225 may be formed between the adjacent insulating pillars 310. The preliminary gate isolation region 225 may be formed in a direction in which word lines to be formed below extends. It is preferable that the preliminary gate isolation region 225 may be formed in the center between the insulating pillars 310. As a consequence, the sidewalls of the gate interlayer insulating layers 211 to 216 and the sacrificial layers 121 to 126 are exposed by the preliminary gate isolation region 225. The buffer layer 110 may be used as an etching stop layer to prevent the semiconductor substrate 100 from being excessively etched.

The common source line CSL is formed in the semiconductor substrate 100 adjacent to the preliminary gate isolation region 225. The common source line CSL may be formed in a line shape extending horizontally. The common source line CSL may be formed by ion implantation. The common source line CSL may be formed by implanting n-type dopant.

Figure 10E:
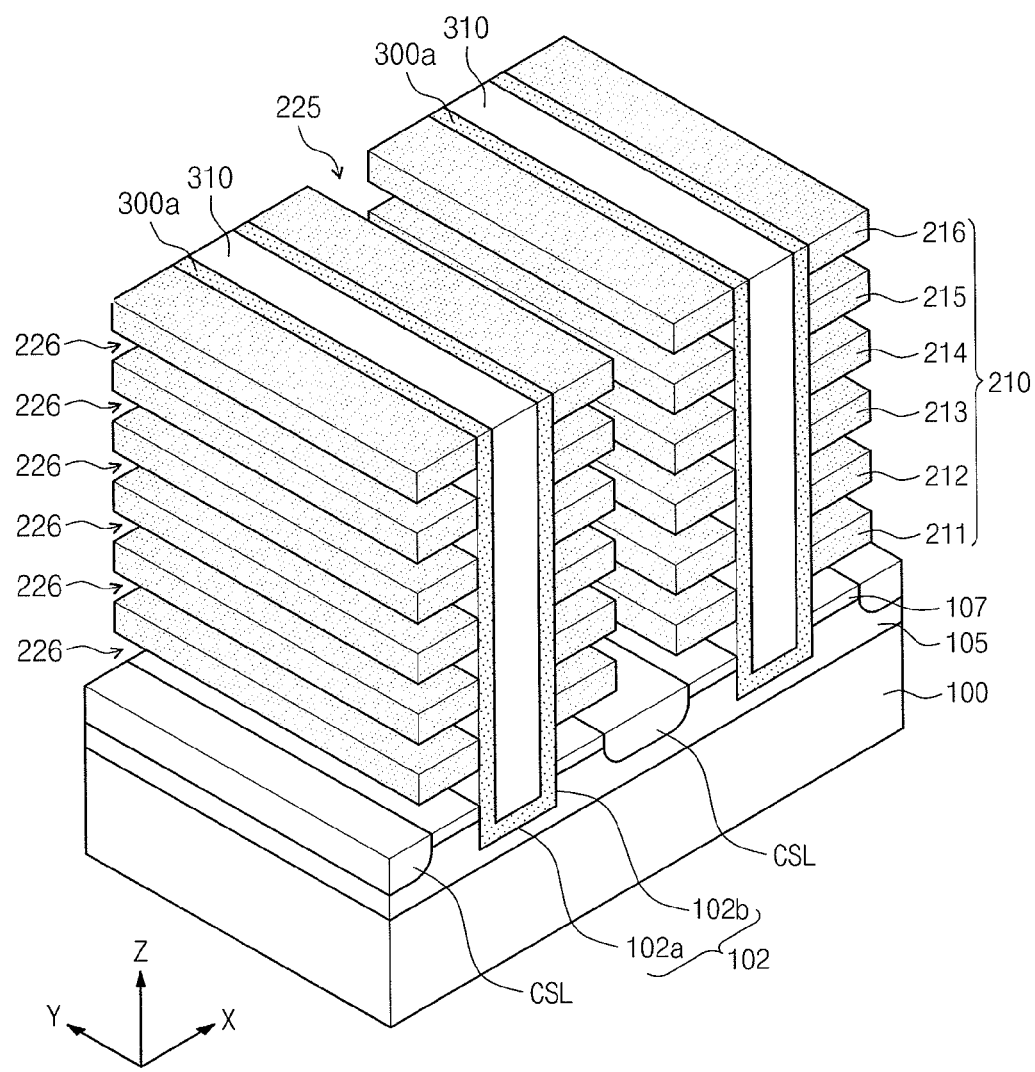

Referring to FIG. 10E, the sacrificial layers 121 to 126 exposed by the preliminary gate isolation region 225 are removed. As a result, gate regions 226 are formed between the gate interlayer insulating layers 211 to 216 so as to expose the sidewall of the semiconductor layer 300a. While the sacrificial layers 121 to 126 are removed, the buffer layer 110 may be removed. The upper surface of the semiconductor substrate 100 may be exposed by the preliminary gate isolation region 225 and the gate regions 226.

Removal of the sacrificial layers 121 to 126 may be performed using an etching recipe having etching selectivity with respect to the sacrificial layers 121 to 126 more than the gate interlayer insulating layers 211 to 216, the semiconductor substrate 100, the semiconductor layer 300a, and the insulating pillars 310. The sacrificial layers 121 to 126 may be removed by isotropic etching.

Figure 10F:
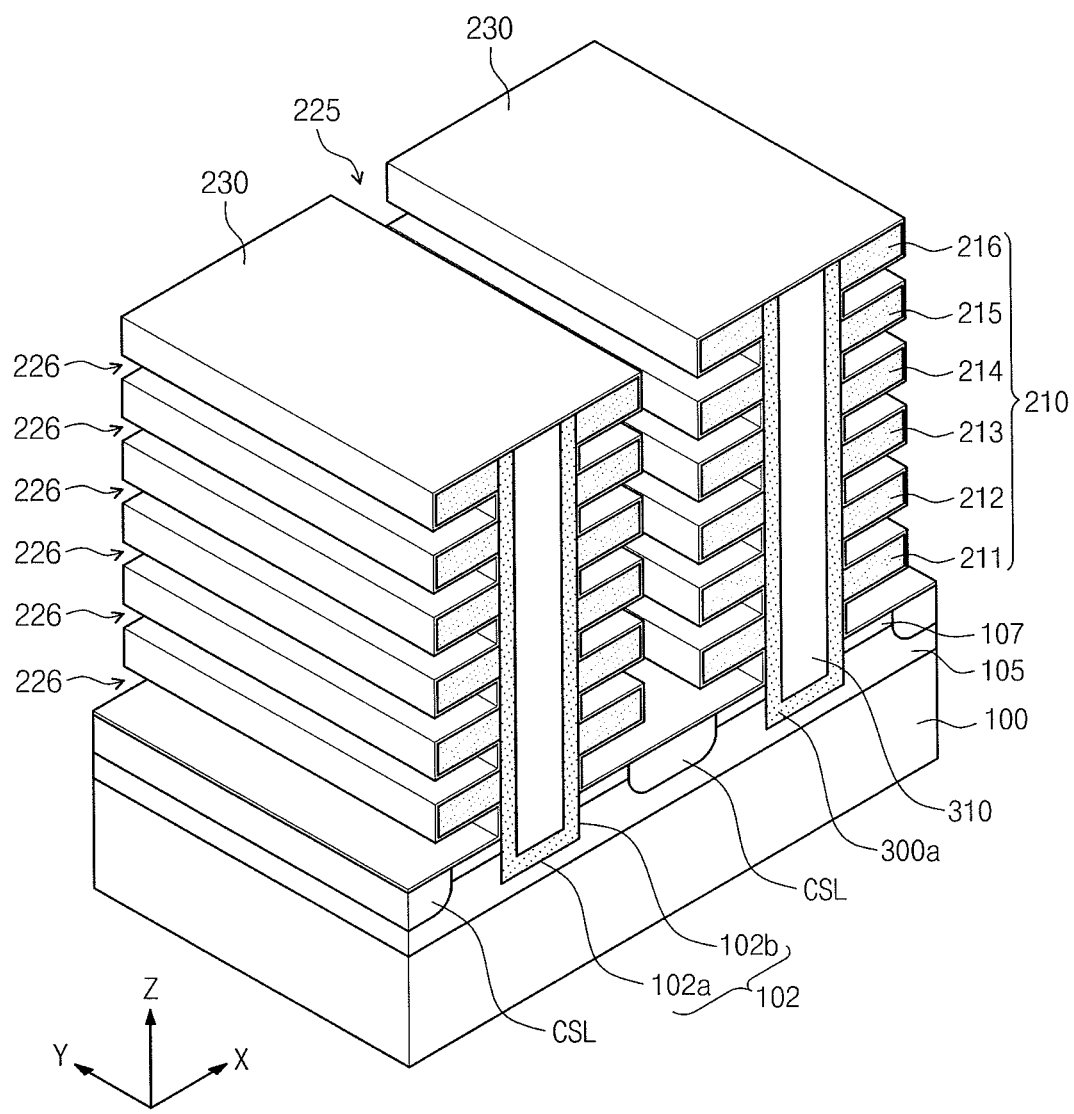

Referring to FIG. 10F, the information storage layer 230 is formed on the resultant product in which the gate regions 226 are formed. The information storage layer 230 may includes the blocking insulating layer, the charge storage layer, and the tunnel insulating layer. The tunnel insulating layer is formed at least to cover the sidewall of the semiconductor layer 300a exposed through the gate regions 226. The charge storage layer and the blocking insulating layer may be formed to conformally cover the resultant product in which the tunnel insulating layer is formed.

Specifically, since the sidewall of the semiconductor layer 300a is exposed through the gate regions 226, the tunnel insulating layer may be formed on the exposed surface of the semiconductor layer 300a by thermal oxidation. The damaged surface of the semiconductor layer 300a may be recovered during the thermal oxidation. The charge storage layer and the blocking insulating layer may be formed using a thin film forming method (for example, chemical vapor deposition or atomic layer deposition) capable of realizing excellent step coverage.

Figure 10G:
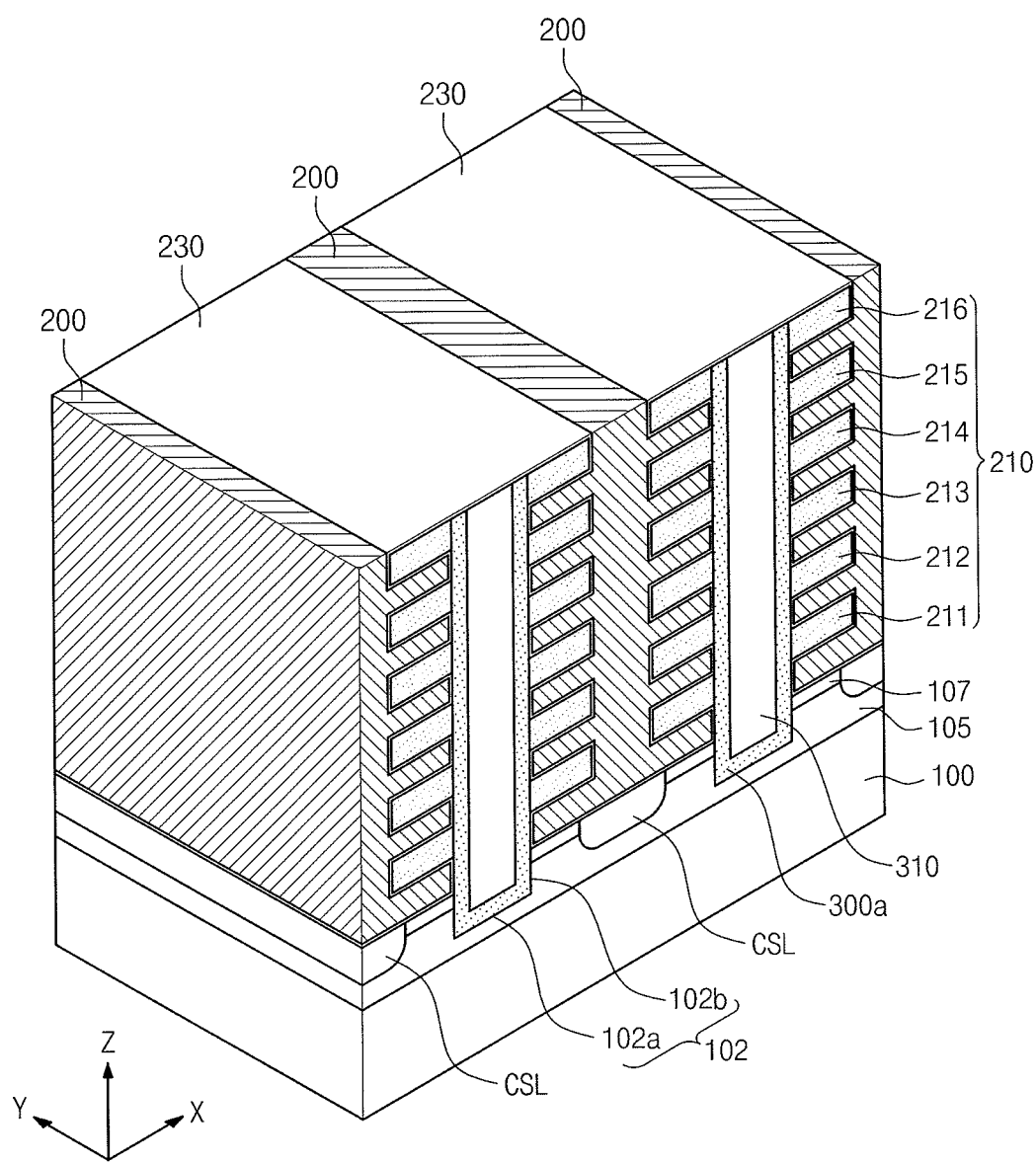

Referring to FIG. 10G, a gate conductive layer 200 is formed on the resultant product in which the information storage layer 230 is formed so as to fill the preliminary gate isolation region 225 and the gate regions 226. The gate conductive layer 200 may be formed by at least one of thin film forming techniques for realizing excellent step coverage. The gate conductive layer 200 may be at least one of a polycrystalline silicon layer, a silicide layer, and a metal layer.

Figure 10H:
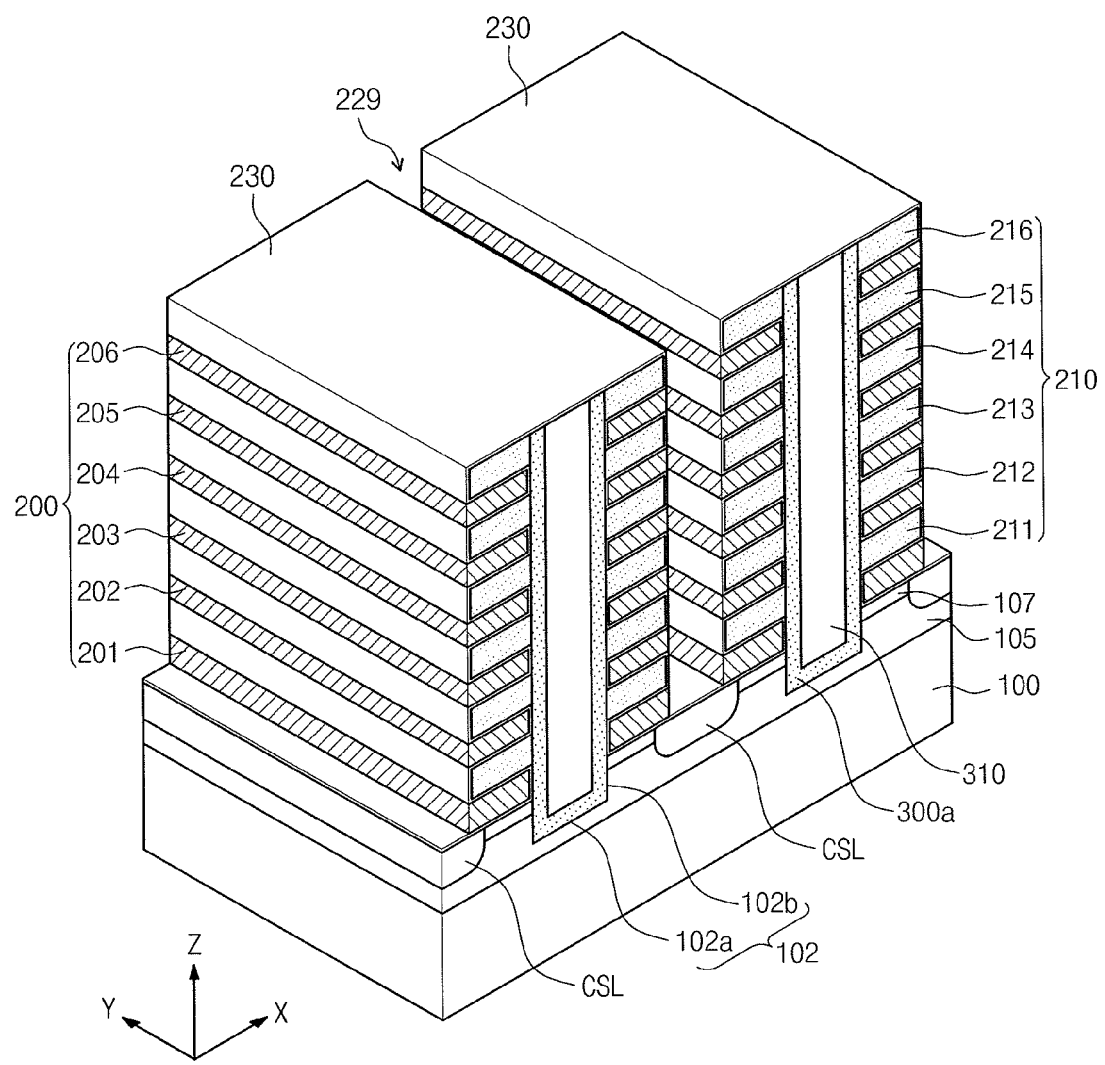

Referring to FIG. 10H, the gate conductive layer 200 is patterned to form a gate isolation region 229 defining the lower select gate 201, word lines 202 to 205, and the upper select gate 206 which are electrically separated from each other. The lower select gate 201, word lines 202 to 205, and the upper select gate 206 form a word line structure 200. The lower select gate 201, word lines 202 to 205, and the upper select gate 206 are vertically separated from each other by the gate interlayer insulating layers 211 to 216.

The forming of the gate isolation region 229 may include forming a photoresist pattern and then performing anisotropic etching on the gate conductive layer 200 using the photoresist pattern as an etching mask. In this case, in order to electrically separate the lower select gate 201, word lines 202 to 205, and the upper select gate 206 from one another, the photoresist pattern may be formed to expose a region broader than the preliminary gate isolation region 225.

Figure 10I:
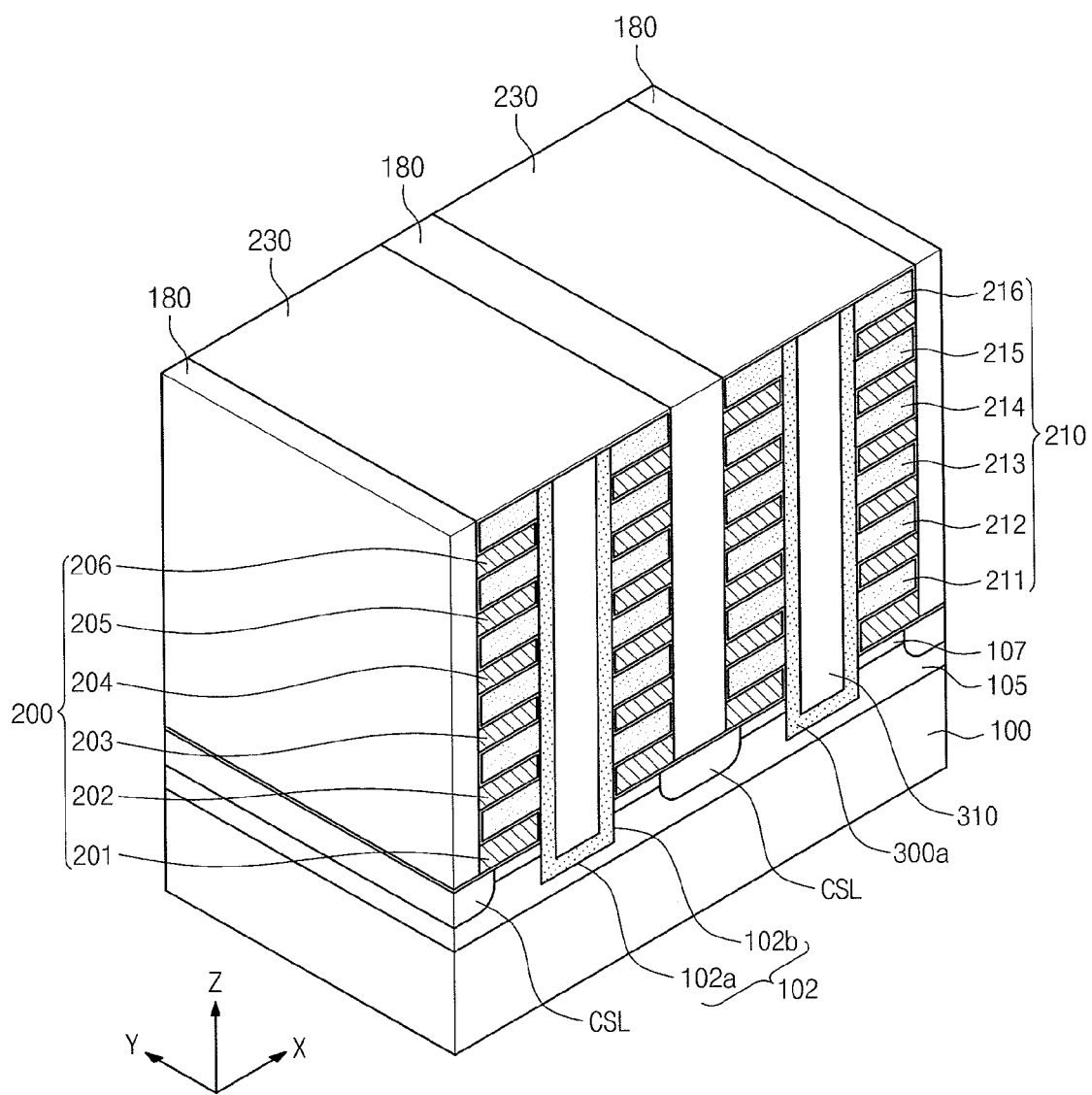
Figure 10J:
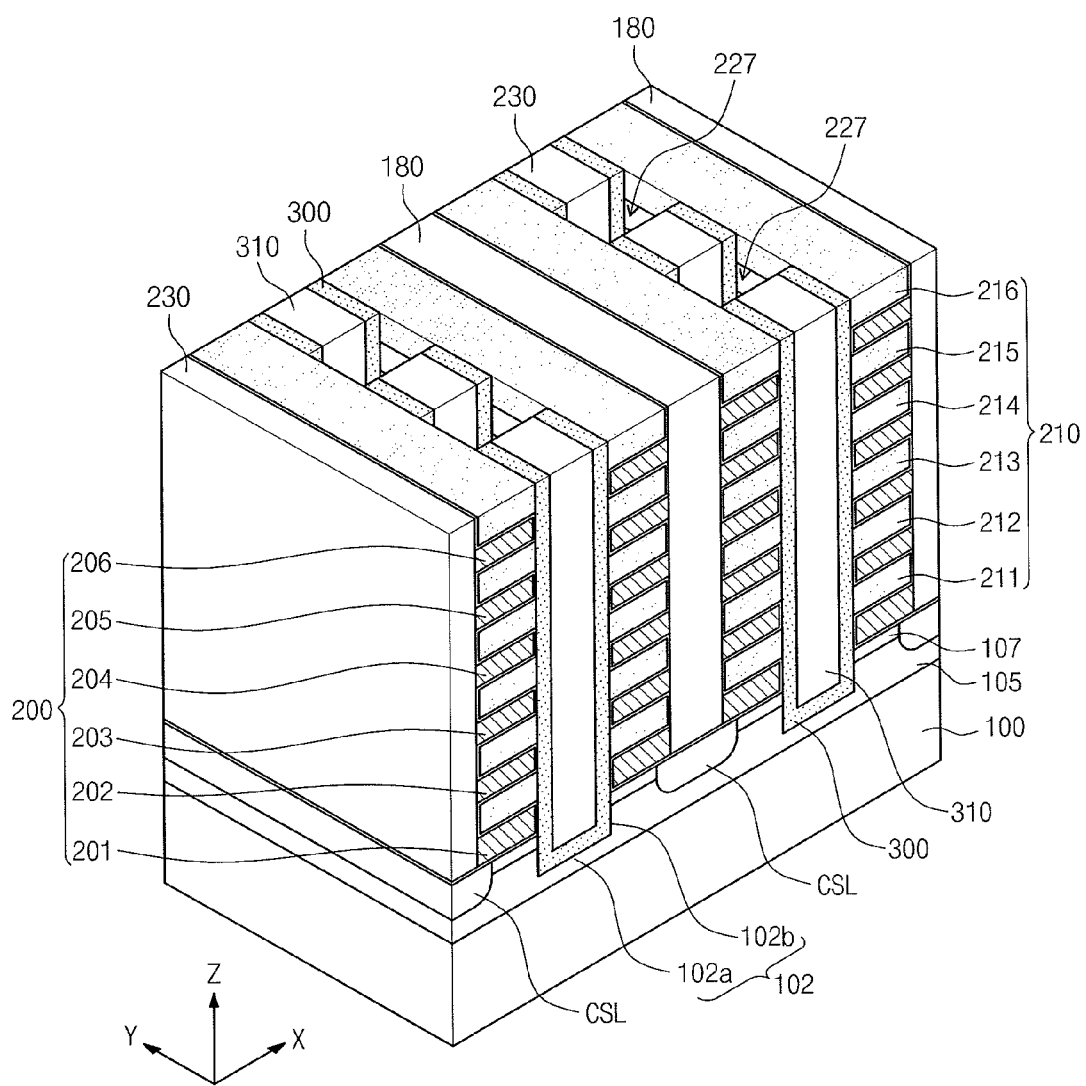

Referring to FIGS. 10I and 10J, the gap-fill insulating layer 180 is formed to fill the gate isolation region 229. Subsequently, as illustrated in FIG. 10J, the semiconductor layers 300a are patterned to form pillar separating regions 227 separating the semiconductor layer 300a two-dimensionally. The active patterns 300 are formed by forming the pillar separating regions 227.

It is preferable that the gap-fill insulting layer 180 is formed of a silicon oxide, but is not limited thereto. The gap-fill insulating layer 180 may be formed of at least one of other various insulating materials. The patterning of the semiconductor layers 300 may include forming a mask pattern to expose the semiconductor layers 300 in a direction intersecting the openings 220 or the gate isolation regions 229, and then performing anisotropic etching on the semiconductor layers 300 using the mask pattern as an etching mask.

Figure 10K:
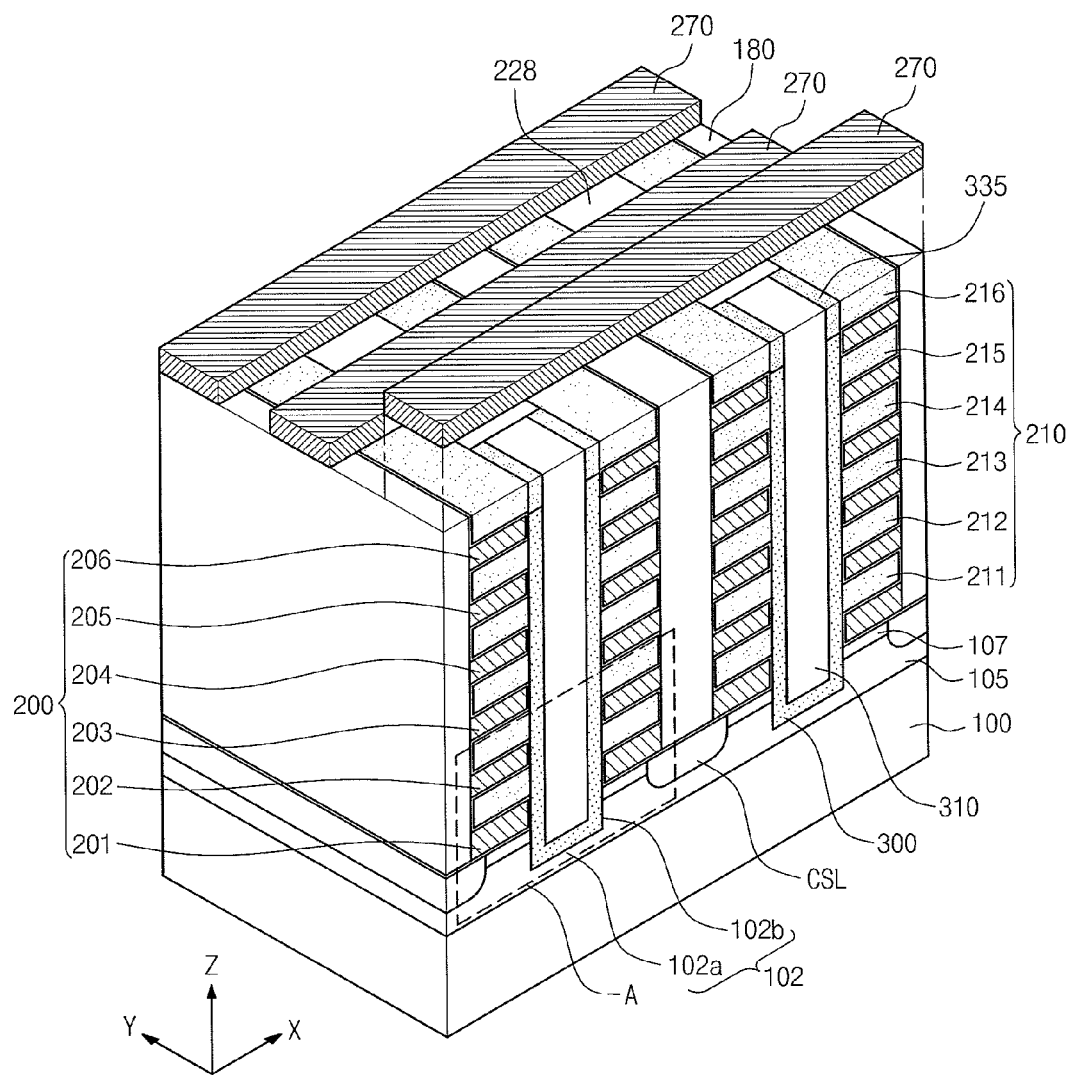

Referring to FIG. 10K, the insulating separation pillar 228 is formed in the pillar separating regions 227. The insulating separation pillar 228 may be formed of a silicon oxide or a silicon nitride. The drain region 335 is formed by ion implantation on the active patterns 300. The bit lines 270 are formed on the drain region 335. The bit lines 270 may extend in a direction intersecting a direction in which the word line structure 200 extends.

According to the embodiment of the inventive concept, the distortion of the electric field of the lower select gate may be minimized by forming the recessed region 102 in the semiconductor substrate 100. Accordingly, it is possible to improve the reliability of the three-dimensional semiconductor memory device.

FIGS. 11A through 11H are diagrams a method of forming a three-dimensional semiconductor memory device according to another embodiment of the inventive concept. Since the configuration in FIGS. 11A to 11I is similar to that according to the above embodiment except for a difference in the shape of the active pattern, the repeated technical features are omitted below for simple description.

Figure 11A:
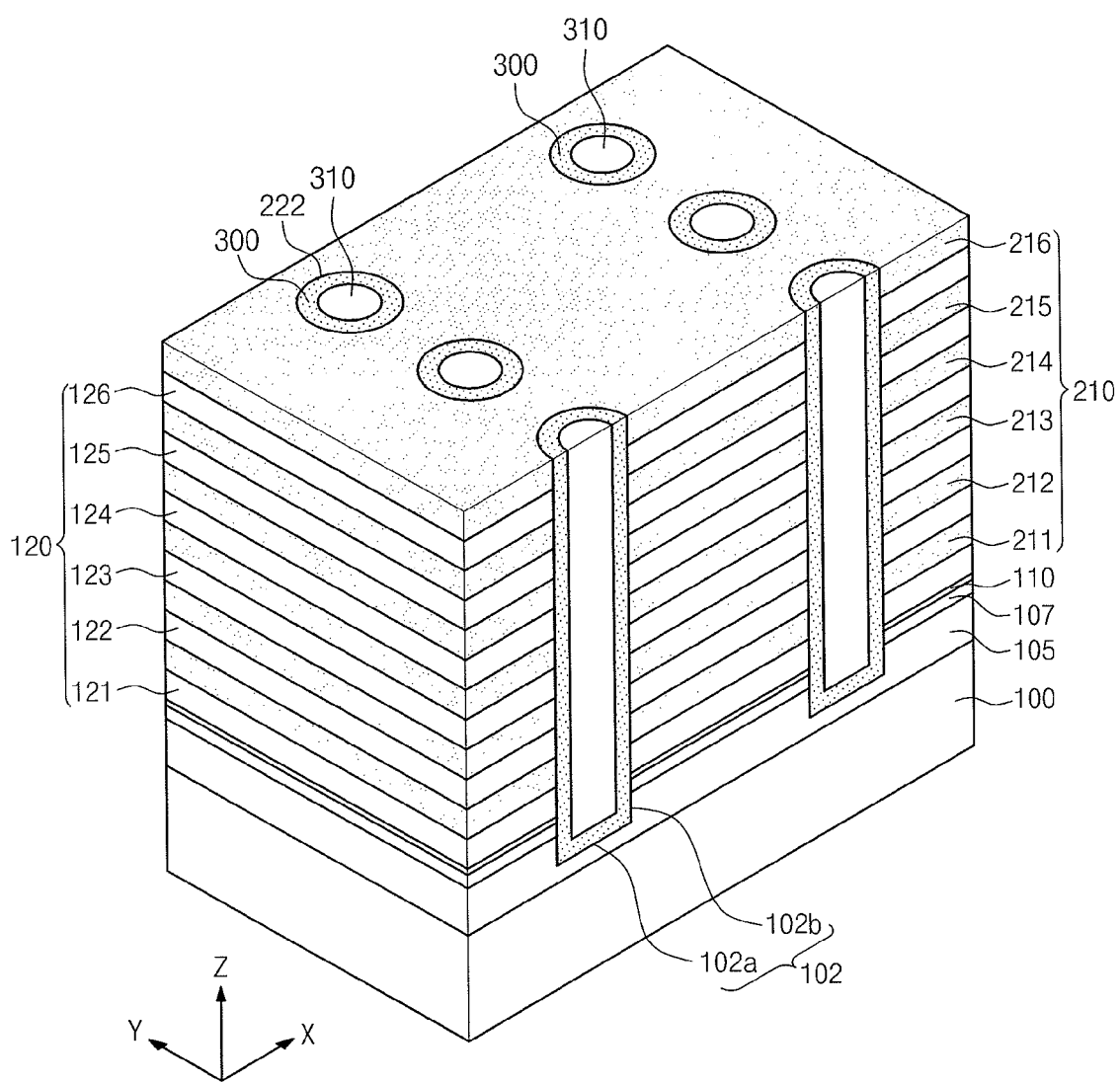
FIGS. 11A through 11H are diagrams illustrating a method of forming a three-dimensional semiconductor memory device according to another embodiment of the inventive concept.

Referring to FIG. 11A, the semiconductor substrate 100 including the well region 105 is prepared. The well region 105 may be formed by ion implantation. The well region 105 contain have p-type dopant. The surface doped layer 107 is formed on the surface of the semiconductor substrate 100. The surface doped layer 107 is a layer for adjusting the threshold voltage of the lower select gate which is described below. The surface doped layer 107 may contain the p-type dopant. Sacrificial layers 121, 122, 123, 124, 125, and 126 and the gate interlayer insulating layers 211, 212, 213, 214, 215, and 216 are alternately formed on the semiconductor substrate 100. That is, the sacrificial layers 121 to 126 organizing a sacrificial layer structure 120 are stacked so as to be spaced apart from each other by the gate interlayer insulating layers 211 to 216, respectively. The interlayer gate insulting layers 211 to 216 interposed between the sacrificial layers 121 to 126, respectively, form a gate interlayer insulating structure 210.

The gate interlayer insulating layers 211 to 216 may be formed of at least one of insulating materials. For example, the gate interlayer insulating layers 211 to 216 may include at least one of a silicon oxide layer or a silicon nitride layer. The sacrificial layers 121 to 126 may be formed of materials which may be removed selectively while minimizing the etching of the gate interlayer insulating layers 211 to 216.

The sacrificial layer 121 is formed on the semiconductor substrate 100 earlier than the gate interlayer insulating layer 211 so that a lower select line, which is formed in the subsequent process, may effectively control the potential of the semiconductor substrate 100 or the well region 105. That is, the sacrificial layer 121 which is formed earliest, as illustrated, is more adjacent to the semiconductor substrate 100 than the gate interlayer insulating layer 211 which is formed earliest. In this case, a buffer layer 110 may be formed between the sacrificial layer 121 and the semiconductor substrate 100.

Subsequently, the gate interlayer insulating structure 210 and the sacrificial layer structure 120 are patterned to form openings 222. The openings 222 may have a hole shape or a cylindrical shape, unlike the openings according to the above embodiment. The recessed region 102 is formed by etching the semiconductor substrate 100 exposed by the openings 222.

The active patterns 300 are formed to cover the inner wall of the opening 222 and the lower surface 102a and the side surfaces 102b of the recessed region 102. The active patterns 300 may have a cylindrical shape. The active patterns 300 may be formed to conformally cover the inner wall of the opening 222 and the recessed region 102 by chemical vapor deposition. Alternatively, the active patterns 300 may fill the openings 222 and the recessed region 102 by an epitaxial technique. The insulating pillar 310 is formed to fill the opening 222 and the recessed region 102 in which the active patterns 300 are formed. The insulating pillar 310 may, for example, be formed of a silicon oxide or a silicon nitride. The insulating pillar 310 may have a cylindrical shape.

Figure 11B:
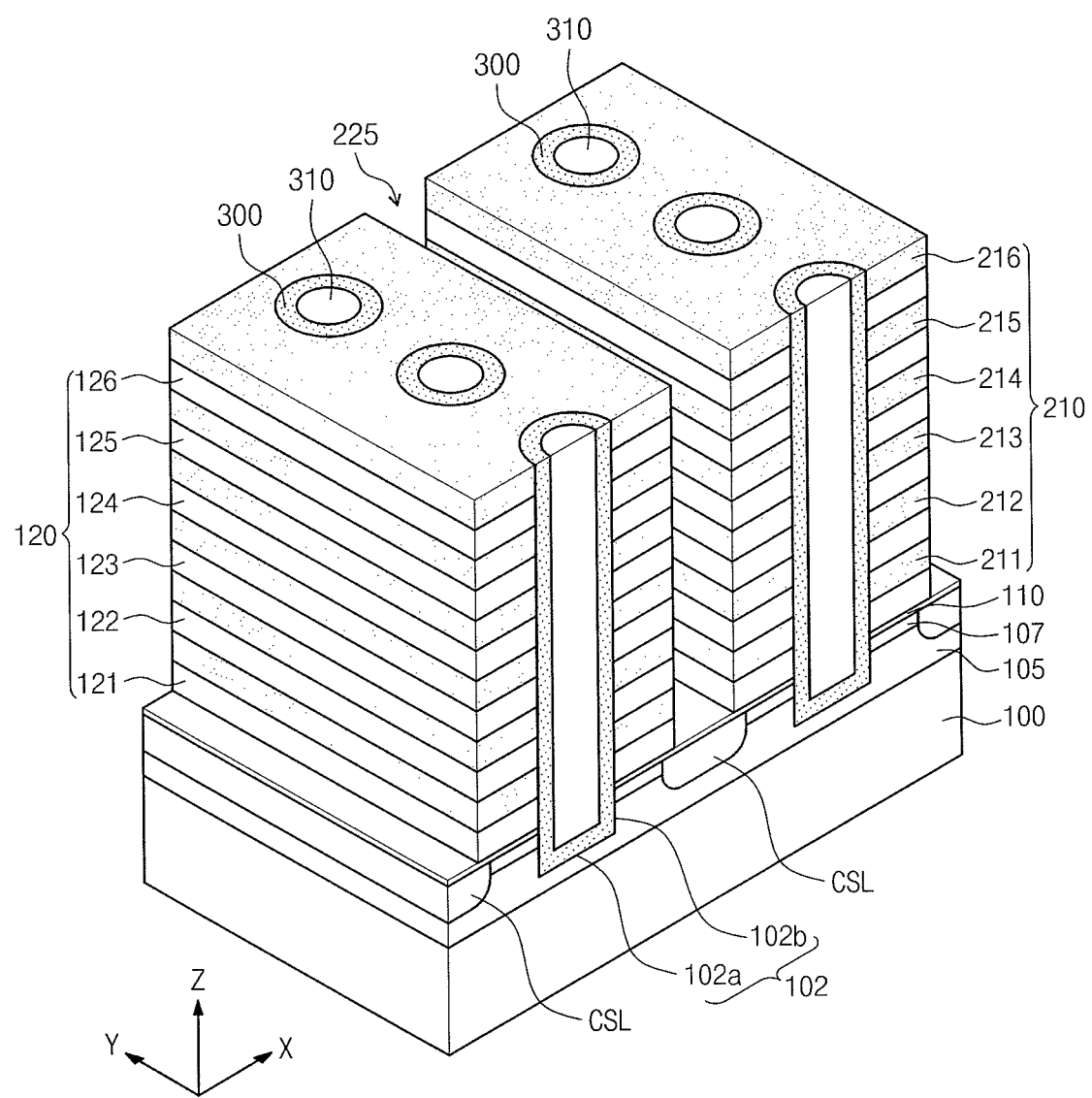

Referring to FIG. 11B, the gate interlayer insulating structure 210 and the sacrificial layer structure 120 are patterned again to form a preliminary gate isolation region 225 between the openings 222 to expose the upper surface of the semiconductor substrate 100 or the buffer layer 110. That is, the preliminary gate isolation region 225 may be formed between the adjacent insulating pillars 310. The preliminary gate isolation region 225 may be formed in a direction in which word lines to be formed below extends. It is preferable that the preliminary gate isolation region 225 may be formed at the center between the insulating pillars 310. As a consequence, the sidewalls of the gate interlayer insulating layers 211 to 216 and the sacrificial layers 121 to 126 are exposed by the preliminary gate isolation region 225. The buffer layer 110 may be used as an etching stop layer to prevent the semiconductor substrate 100 from being excessively etched.

The common source line CSL is formed in the semiconductor substrate 100 adjacent to the preliminary gate isolation region 225. The common source line CSL may be formed in a line shape extending horizontally. The common source line CSL may be formed by ion implantation. The common source line CSL may be formed by implanting n-type dopant.

Figure 11C:
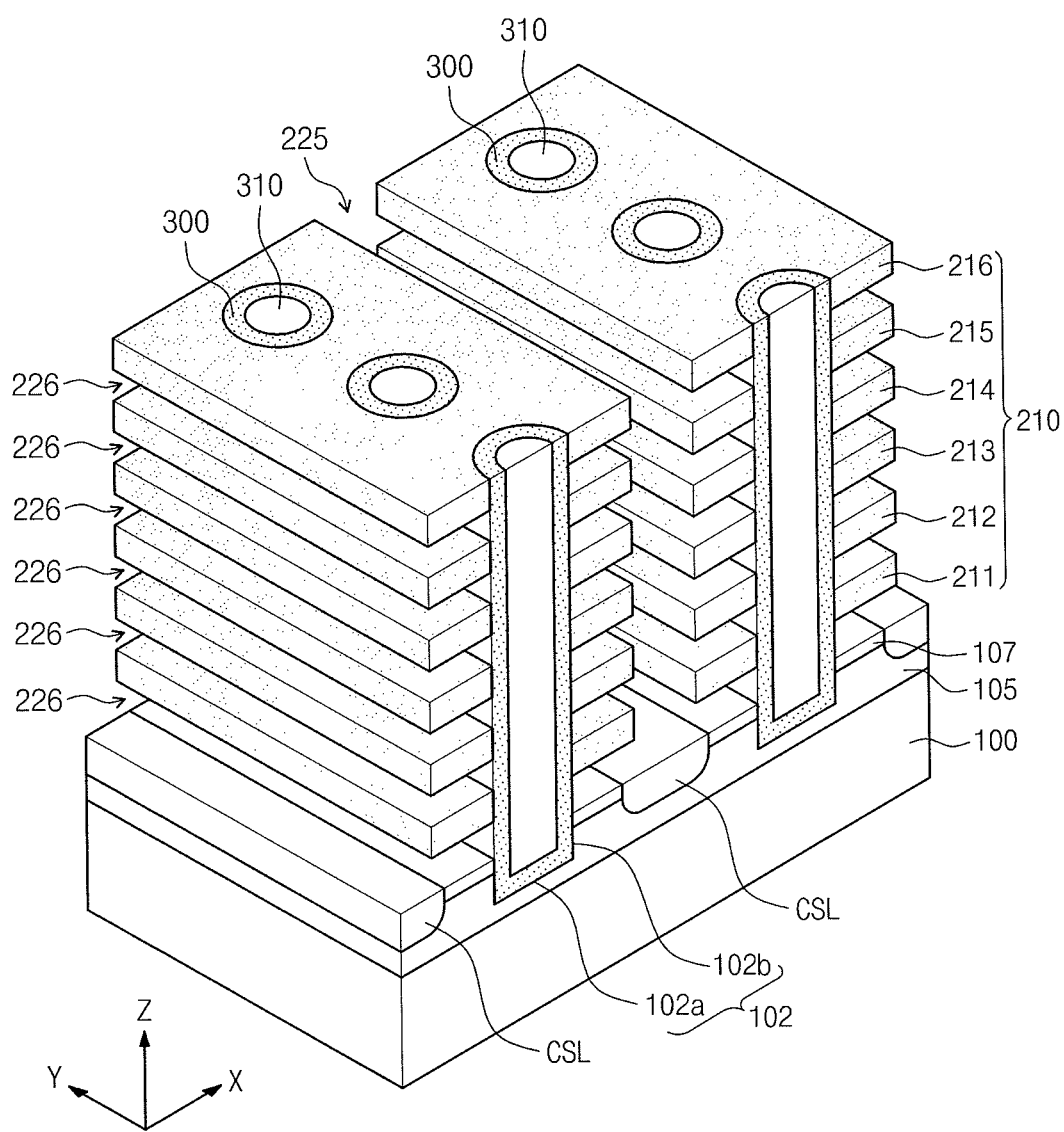

Referring to FIG. 11C, the sacrificial layers 121 to 126 exposed by the preliminary gate isolation region 225 are removed. As a consequence, gate regions 226 are formed between the gate interlayer insulating layers 211 to 216 so as to expose the sidewall of the semiconductor layer 300a. At the same time the sacrificial layers 121 to 126 are removed, the buffer layer 110 may be removed. The upper surface of the semiconductor substrate 100 may be exposed by the preliminary gate isolation region 225 and the gate regions 226.

Removal of the sacrificial layers 121 to 126 may be performed using an etching recipe having etching selectivity for the sacrificial layers 121 to 126 more than the gate interlayer insulating layers 211 to 216, the semiconductor substrate 100, the active patterns 300, and the insulating pillars 310. Alternatively, the sacrificial layers 121 to 126 may be removed by isotropic etching.

Figure 11D:
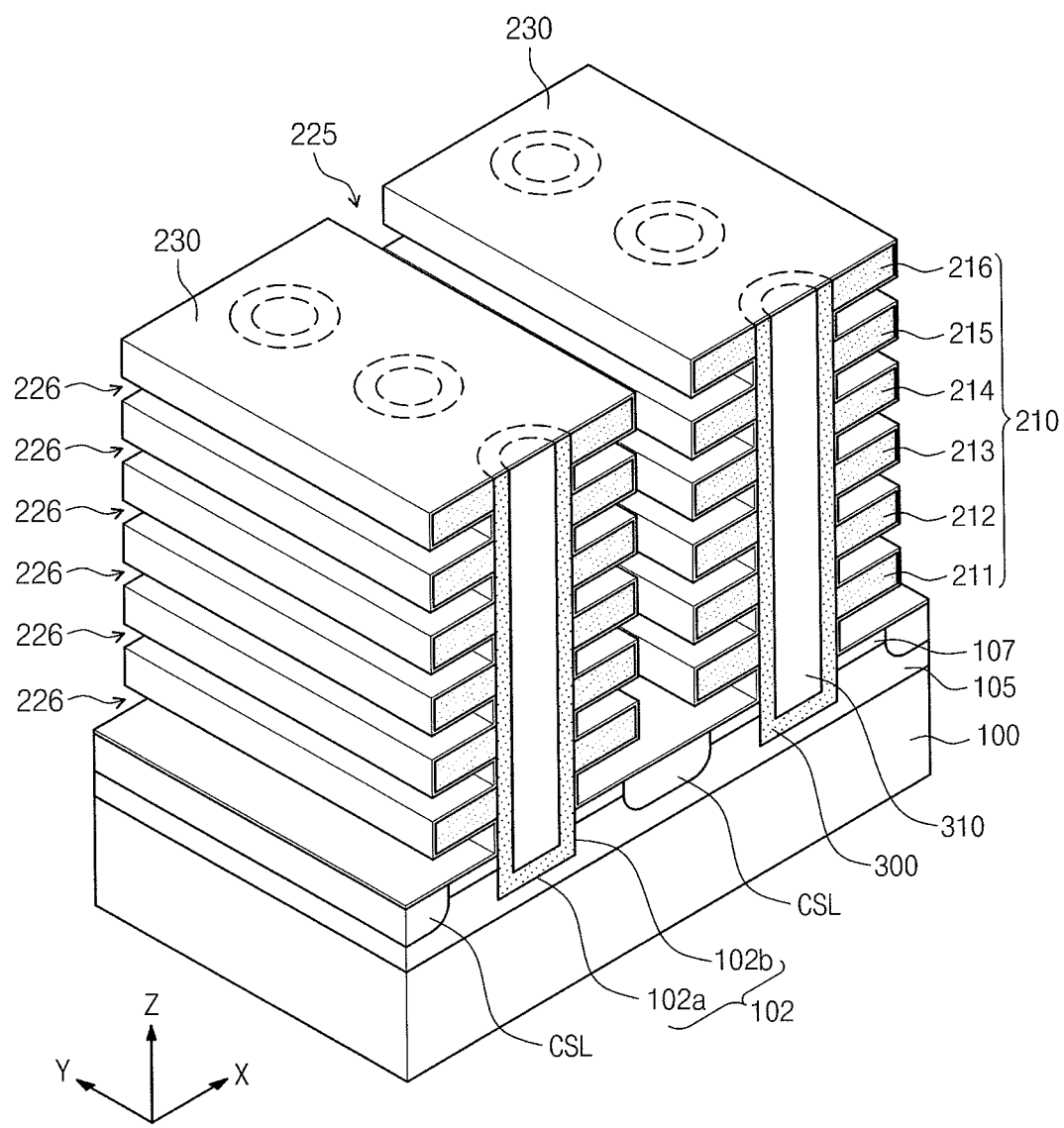

Referring to FIG. 11D, the information storage layer 230 is formed on the resultant product in which the gate regions 226 are formed. The information storage layer 230 may includes the blocking insulating layer, the charge storage layer, and the tunnel insulating layer. The tunnel insulating layer is formed at least to cover the sidewall of the active patterns 300 exposed through the gate regions 226. The charge storage layer and the blocking insulating layer may be formed to conformally cover the resultant product in which the tunnel insulating layer is formed.

Specifically, since the sidewalls of the active patterns 300 are exposed through the gate regions 226, the tunnel insulating layer may be formed on the exposed surface of the active patterns 300 by thermal oxidation. The damaged surface of the active patterns 300 may be recovered during the thermal oxidation. The charge storage layer and the blocking insulating layer may be formed using a thin film forming method (for example, chemical vapor deposition or atomic layer deposition) capable of realizing excellent step coverage.

Figure 11E:
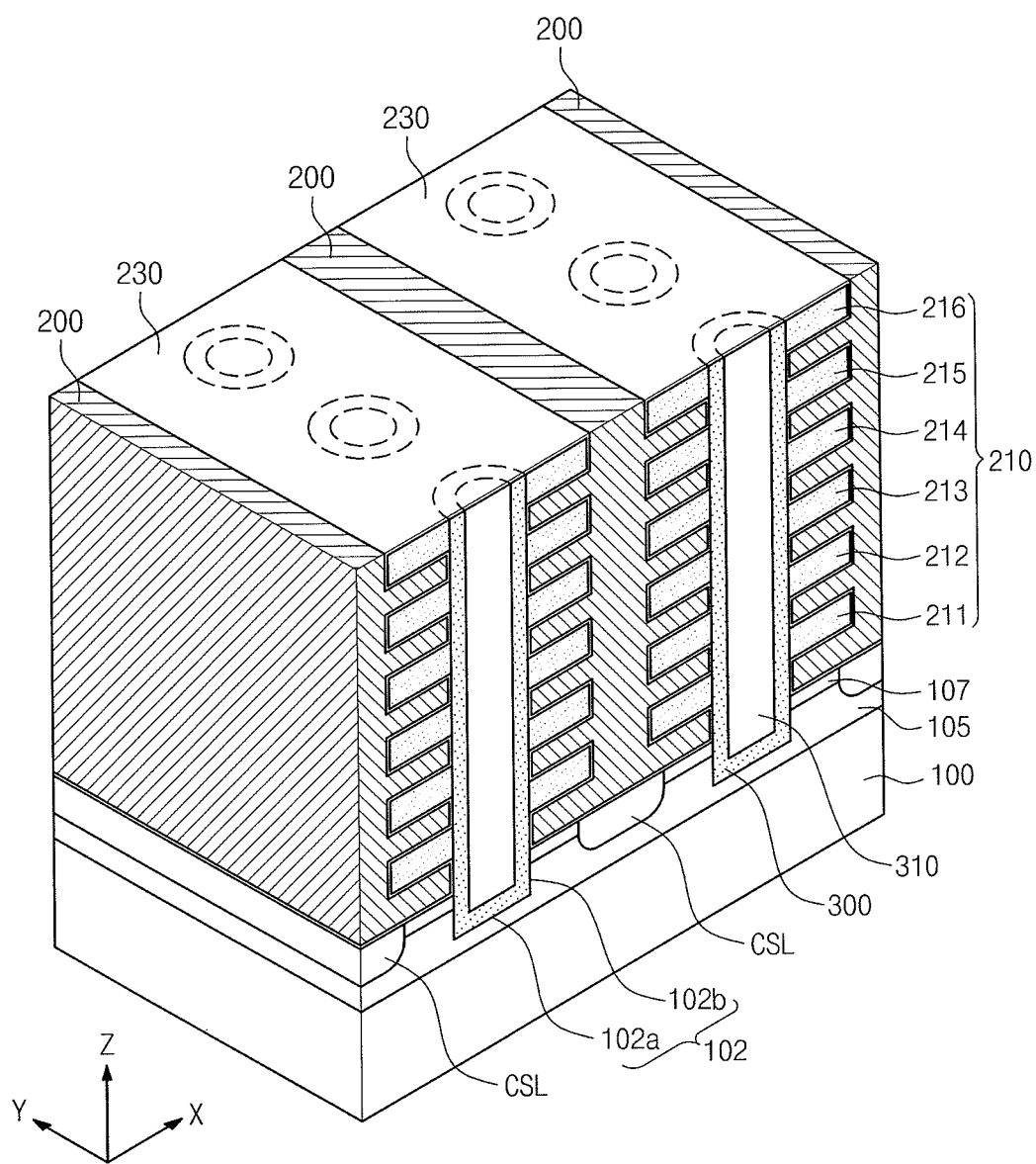

Referring to FIG. 11E, a gate conductive layer 200 is formed on the resultant product in which the information storage layer 230 is formed so as to fill the preliminary gate isolation region 225 and the gate regions 226. The gate conductive layer 200 may be formed by at least one of thin film forming techniques for realizing excellent step coverage. The gate conductive layer 200 may be at least one of a polycrystalline silicon layer, a silicide layer, and a metal layer.

Figure 11F:
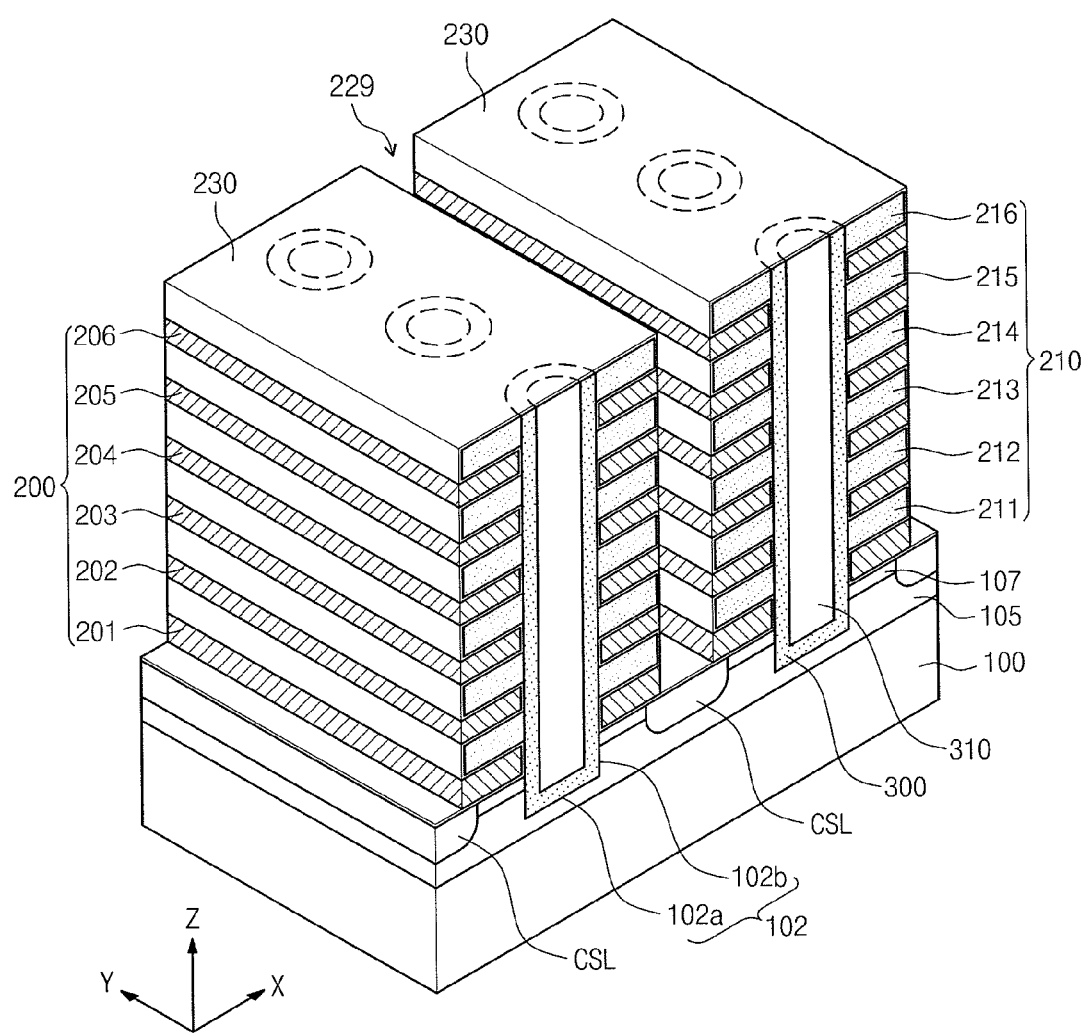

Referring to FIG. 11F, the gate conductive layer 200 is patterned to form the gate isolation region 229 defining the lower select gate 201, word lines 202 to 205, and the upper select gate 206 which are electrically separated from one another. The lower select gate 201, word lines 202 to 205, and the upper select gate 206 form a word line structure 200. The lower select gate 201, word lines 202 to 205, and the upper select gate 206 are separated from each other in a vertical direction by the gate interlayer insulating layers 211 to 216.

Formation of the gate isolation region 229 may include forming a photoresist pattern and then performing anisotropic etching on the gate conductive layer 200 using the photoresist pattern as an etching mask. In this case, in order to electrically separate the lower select gate 201, word lines 202 to 205, and the upper select gate 206 from one another, the photoresist pattern may be formed to expose a region larger than the preliminary gate isolation region 225.

Figure 11G:
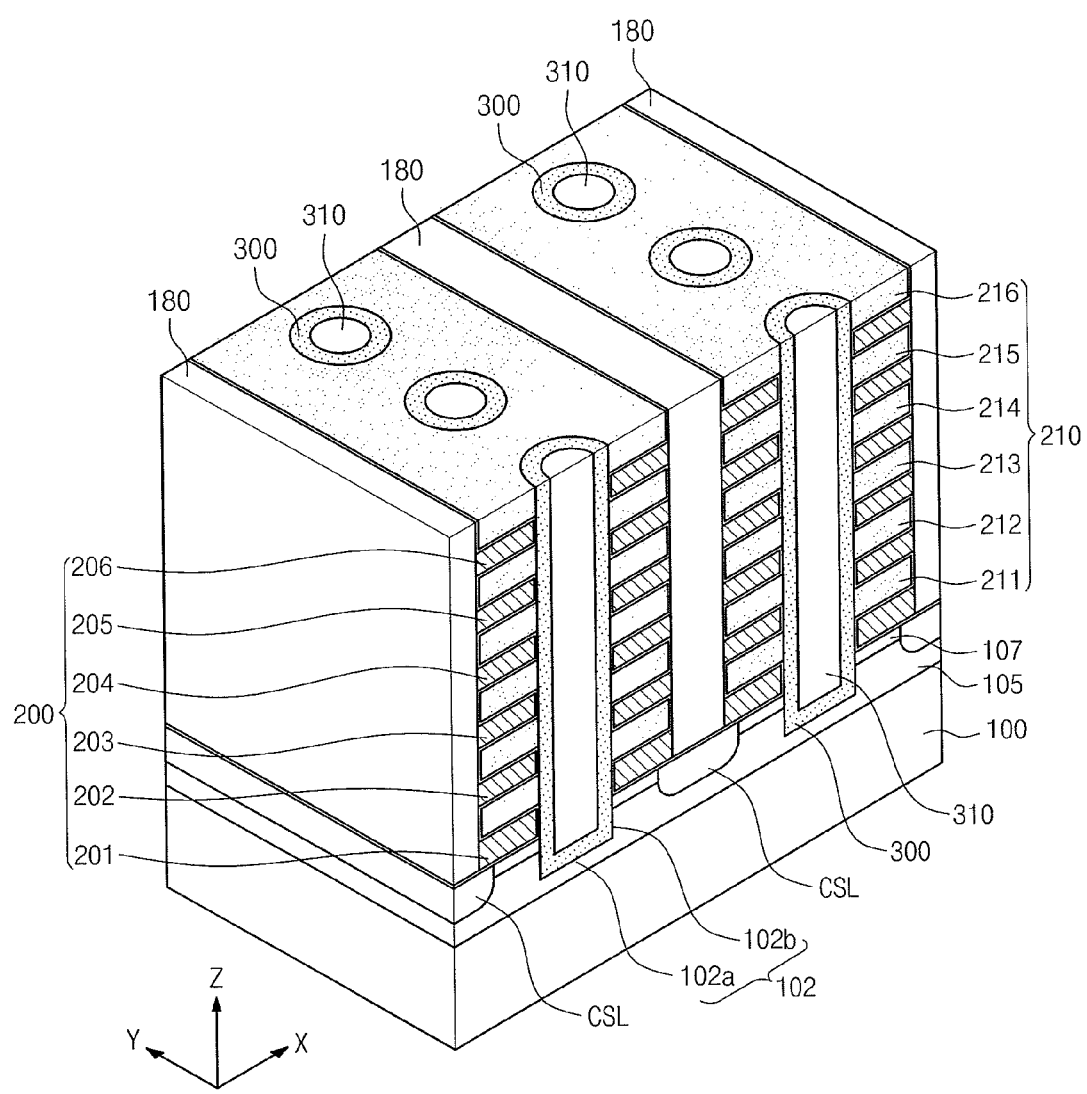

Referring to FIG. 11G, the gap-fill insulating layer 180 is formed to fill the gate isolation region 229. It is preferable that the gap-fill insulting layer 180 is formed of a silicon oxide, but is not limited thereto. The gap-fill insulating layer 180 may be formed of at least one of other various insulating materials. The gap-fill insulating layer 180 is formed, and then the upper surfaces of the active patterns 300 are exposed.

Figure 11H:
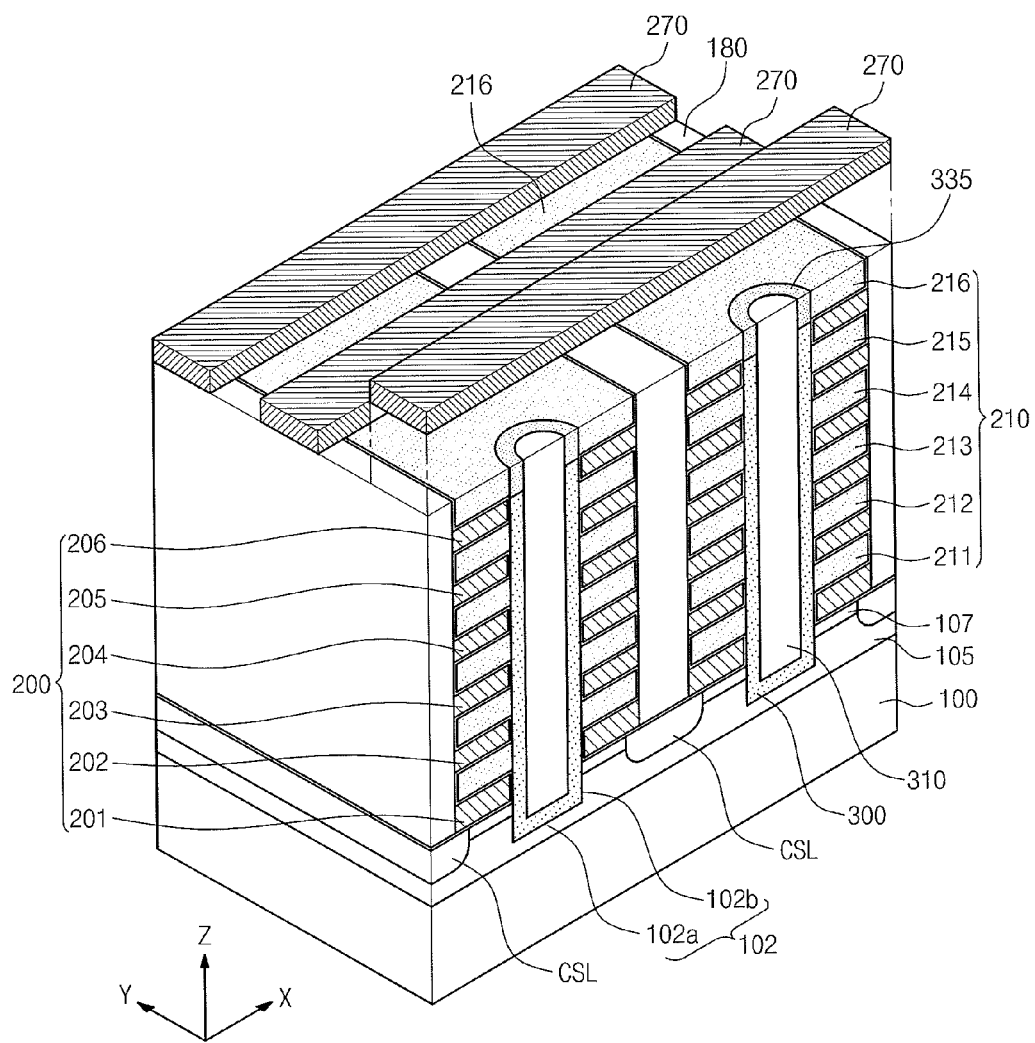

Referring to FIG. 11H, the drain region 335 is formed by ion implantation on the active patterns 300. The bit lines 270 are formed on the drain region 335. The bit lines 270 may extend in a direction intersecting a direction in which the word line structure 200 extends.

According to embodiments of the inventive concepts, the distortion of the electric field of the lower select gate may be minimized by forming the recessed region 102 in the semiconductor substrate 100. Accordingly, it is possible to improve the reliability of the resulting three-dimensional semiconductor memory device.

The three-dimensional semiconductor memory device according to the above-described embodiments may be realized in various types of semiconductor packages. For example, the three-dimensional memory device according to the embodiments of the inventive concept may be packaged in a way such as package on package (PoP), ball grid array (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), thin quad flatpack (TQFP), system in package (SIP), multi chip package (MCP), wafer-level fabricated package (WFP), or wafer-level processed stack package (WSP). A package mounted with the three-dimensional semiconductor memory device according to the embodiments of the inventive concept may further include a controller and/or a logic device, for example, controlling the three-dimensional semiconductor memory device.

Figure 12:
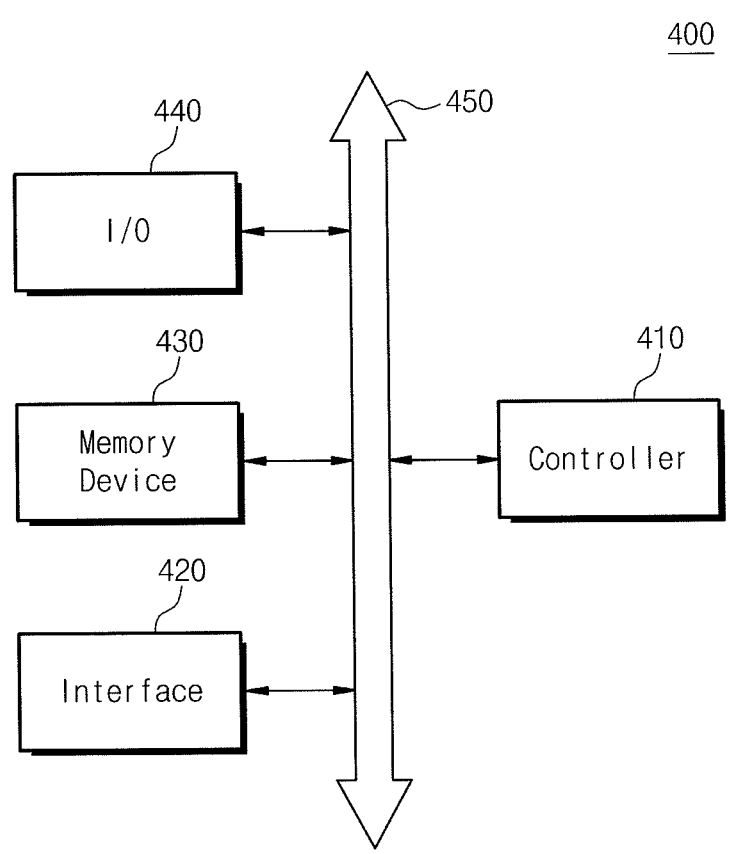
FIG. 12 is a block diagram illustrating an electronic system including the three-dimensional semiconductor memory device according to the embodiments of the inventive concept.

FIG. 12 is a block diagram illustrating an electronic system including the three-dimensional semiconductor memory device according to the embodiments of the inventive concept.

Referring to FIG. 12, an electronic system 400 according to an embodiment of the inventive concept may include a controller 410, an input/output device (I/O) 420, a memory device 430, an interface 440, and a bus 450. The controller 410, the I/O device 420, the memory device 430, and/or the interface 440 may be connected to each other through the bus 450. The bus 450 corresponds to a transfer path of data.

The controller 410 includes at least one of a microprocessor, a digital signal processor, a microcontroller, and logic devices executing similar functions thereof. The I/O device 420 may include a key pad, a keyboard, or a display device. The memory device 430 may store data and/or commands, and the like. The memory device 430 may include at least one of the three-dimensional semiconductor memory device disclosed in the above-described embodiments. The memory device 430 may further include other types of semiconductor memory devices (for example, a phase change memory device, a magnetic memory device, a DRAM device, and/or an SRAM device). The interface 440 executes a function of transmitting data to a communication network or receiving data from a communication network. The interface 440 may be realized in a wireless or wired fond. For example, the interface 440 may include an antenna or a wireless/wired transceiver. Even though not illustrated, the electronic system 400 may further include an operational memory such as a high-speed DRAM and/or a high-speed SRAM for improving the operation of the controller 410.

The electronic system 400 is applicable to a personal digital assistant (PDA), a portable computer, a web tablet, a wireless phone, a mobile phone, a digital music player, a memory card, or any electronic apparatus capable of transmitting and/or receiving information in a wireless environment.

Figure 13:
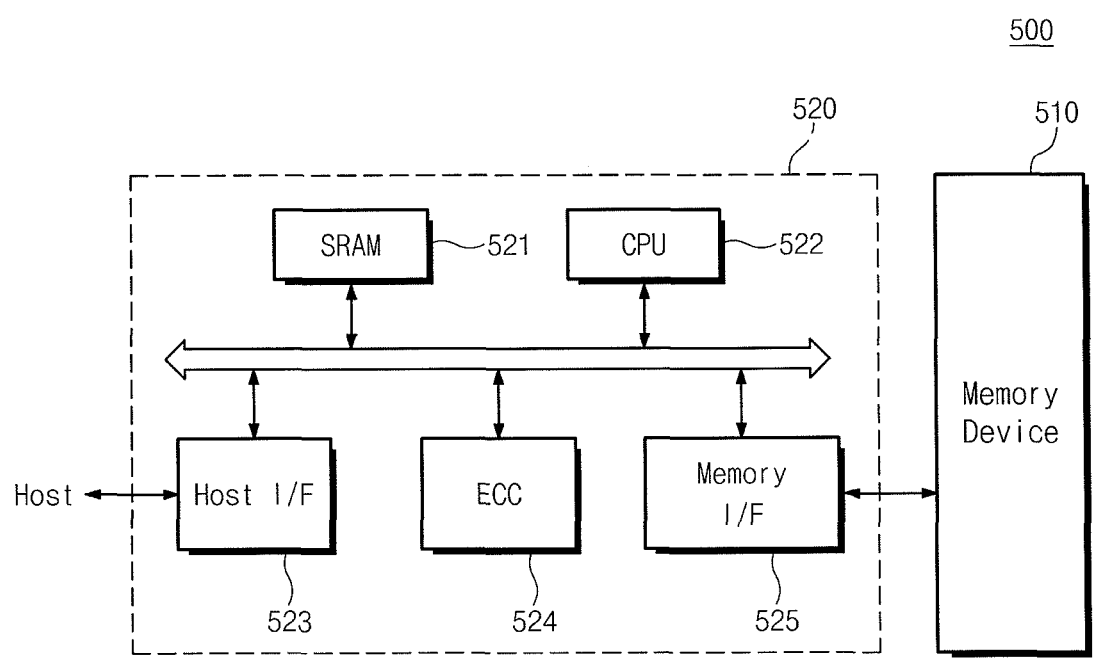
FIG. 13 is a block diagram illustrating a memory card including the three-dimensional semiconductor memory device according to the embodiments of the inventive concept.

FIG. 13 is a block diagram illustrating a memory card including the three-dimensional semiconductor memory device according to the embodiments of the inventive concept.

Referring to FIG. 13, a memory card 500 includes a memory device 510. The memory device 510 may include at least one of the three-dimensional semiconductor memory devices disclosed in the above-described embodiments. The memory device 510 may further include other types of semiconductor memory devices (for example, a phase change memory device, a magnetic memory device, a DRAM device, and/or an SRAM device). The memory card 500 may include a memory controller 520 controlling data exchange between a host and the memory device 510.

The memory controller 520 may include a processing unit 522 generally controlling the memory card. The memory controller 520 may include an SRAM 521 used as an operational memory of the processing unit 522. The memory controller 520 may further include a host interface 523 and a memory interface 525. The host interface 523 may have a protocol for exchanging data between the memory card 500 and a host. The memory interface 525 may connect to the memory controller 520 to the memory device 510. The memory controller 520 may further include an error correction coding block (Ecc) 524. The error correction coding block 524 may detect and correct an error of data read from the memory device 510. Even though not illustrated, the memory card 500 may further include a ROM device storing code data used to interface a host. The memory card 500 may be used as a portable data storing card. Alternatively, the memory card 500 may be realized as a solid state disk (SSD) replacing a hard disk drive of a computer system.

According to the embodiments of the inventive concept, the active patterns are disposed at recessed regions of the semiconductor substrate. Since the active patterns are provided at the recessed regions, it is possible to minimize the distortion of the electric field at the corner of the insulating pillar. In addition, since the channel region of the lower select gate has a lower channel dose, the lower select gate may more readily form the inversion region. Accordingly, the reliability of the three-dimensional semiconductor memory device may be improved.

The above-disclosed subject matter is to be considered illustrative and not restrictive, and the appended claims are intended to cover all such modifications, enhancements, and other embodiments, which fall within the true spirit and scope of the inventive concept is to be determined by the broadest permissible interpretation of the following claims and their equivalents, and shall not be restricted or limited by the foregoing detailed description.

What is claimed is:

1. A three-dimensional semiconductor memory device comprising:
 a semiconductor substrate having a recessed region;
 an active pattern extending from the recessed region in a direction perpendicular to the substrate;
 an insulating pillar being adjacent to the active pattern and extending in the direction perpendicular to the substrate; and
 a lower select gate facing the active pattern and extending horizontally on the semiconductor substrate.

2. The three-dimensional semiconductor memory device of claim 1, wherein the active pattern has a cylindrical shape.

3. The three-dimensional semiconductor memory device of claim 1, wherein the active pattern is disposed to cover a lower surface and a side surface of the recessed region, and wherein the insulating pillar fills the recessed region in which the active pattern is disposed.

4. The three-dimensional semiconductor memory device of claim 3, wherein the position of a lower surface of the insulating pillar is lower than that of an upper surface of the semiconductor substrate.

5. The three-dimensional semiconductor memory device of claim 1, further comprising a common source line present in the semiconductor substrate and extending in parallel along a direction in which the lower select gate extends.

6. The three-dimensional semiconductor memory device of claim 5, wherein the lower select gate controls a first channel region, which is defined in the semiconductor substrate between the active pattern and the common source line, and a second channel region, which is defined in the active pattern.

7. The three-dimensional semiconductor memory device of claim 6, wherein the first channel region contains dopants which adjust a threshold voltage.

8. The three-dimensional semiconductor memory device of claim 7, wherein the first channel region contains a first conductive type dopant, and the common source line contains a second conductive type dopant.

9. The three-dimensional semiconductor memory device of claim 1, further comprising:
 word lines and an upper select gate being disposed on the lower select gate so as to be spaced apart from each other and extending horizontally; and
 information storage layers interposed between the active pattern and the lower select gate, between the active pattern and the word lines, and between the active pattern and the upper select line.

10. The three-dimensional semiconductor memory device of claim 1, further comprising:
 a p-well provided in the semiconductor substrate,
 wherein the p-well comes into contact with the active pattern.

11. The three-dimensional semiconductor memory device of claim 1, wherein the active pattern is disposed between the insulating pillar and the lower select gate.

12. The three-dimensional semiconductor memory device of claim 1, wherein the active pattern contacts a lower surface of the recessed region.

13. A three-dimensional semiconductor memory device comprising:
 a semiconductor substrate having a recessed region;
 an active pattern extending from the recessed region in a direction perpendicular to the substrate; and
 a lower select gate facing the active pattern and extending horizontally on the semiconductor substrate.

14. The three-dimensional semiconductor memory device of claim 13, further comprising an insulating pillar adjacent to the active pattern and extending in the direction perpendicular to the substrate.

15. The three-dimensional semiconductor memory device of claim 13, wherein the active pattern contacts with a lower surface of the recessed region.

16. The three-dimensional semiconductor memory device of claim 13, further comprising an information storage layer disposed between the active pattern and the lower select gate.

17. A three-dimensional semiconductor memory device comprising:
 a semiconductor substrate having a recessed region;
 an active pattern extending from the recessed region in a direction perpendicular to the substrate;
 an insulating pillar adjacent to the active pattern and extending in the direction perpendicular to the substrate; and
 wherein the active pattern contacts a lower surface of the recessed region and wherein a bottom surface of the active pattern is lower than a bottom surface of the insulating pillar.

18. The three-dimensional semiconductor memory device of claim 17, further comprising a lower select gate facing the active pattern and extending horizontally on the semiconductor substrate.

19. The three-dimensional semiconductor memory device of claim 18, further comprising:
 word lines disposed on the lower select gate; and
 information storage layers interposed between the active pattern and the word lines.

20. The three-dimensional semiconductor memory device of claim 19, wherein the information storage layers extends between the active pattern and the lower select gate.

21. The three-dimensional semiconductor memory device of claim 17, wherein the active pattern is between the insulating pillar and the lower surface of the recessed region.

* * * * *